United States Patent
Song et al.

(10) Patent No.: US 10,037,401 B2
(45) Date of Patent: Jul. 31, 2018

(54) METHODS OF DESIGNING A LAYOUT OF A SEMICONDUCTOR DEVICE INCLUDING FIELD EFFECT TRANSISTOR AND METHODS OF MANUFACTURING A SEMICONDUCTOR DEVICE USING THE SAME

(71) Applicant: SAMSUNG ELECTRONICS CO., LTD., Suwon-si, Gyeonggi-Do (KR)

(72) Inventors: Taejoong Song, Seongnam-si (KR); Sanghoon Baek, Seoul (KR); Sungwe Cho, Hwaseong-si (KR); Jung-Ho Do, Yongin-si (KR); Giyoung Yang, Seoul (KR); Jinyoung Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/896,415

(22) Filed: Feb. 14, 2018

(65) Prior Publication Data

US 2018/0173836 A1  Jun. 21, 2018

Related U.S. Application Data

(63) Continuation of application No. 15/184,227, filed on Jun. 16, 2016, now Pat. No. 9,928,333.

(30) Foreign Application Priority Data

Jul. 30, 2015  (KR) .......................... 10-2015-0108171
Nov. 10, 2015  (KR) .......................... 10-2015-0157565

(51) Int. Cl.
| G06F 17/50 | (2006.01) |
| H01L 27/118 | (2006.01) |
| H01L 27/02 | (2006.01) |

(52) U.S. Cl.
CPC ...... *G06F 17/5077* (2013.01); *H01L 27/0207* (2013.01); *H01L 27/11807* (2013.01)

(58) Field of Classification Search
CPC .................................................. G06F 17/5077
USPC .......................................................... 716/119
See application file for complete search history.

(56) References Cited

U.S. PATENT DOCUMENTS

| 6,480,997 | B1 | 11/2002 | Tanaka |
| 6,567,967 | B2 | 5/2003 | Greidinger et al. |
| 6,948,145 | B2 | 9/2005 | Brown, III et al. |
| 7,989,849 | B2 | 8/2011 | Sherlekar et al. |
| 8,037,441 | B2 | 10/2011 | Ringe et al. |
| 8,239,807 | B2 | 8/2012 | Arora et al. |
| 8,431,968 | B2 | 4/2013 | Lu et al. |
| 8,516,428 | B2 | 8/2013 | Bowers et al. |
| 8,525,552 | B2 | 9/2013 | Ando et al. |
| 8,959,472 | B1 | 2/2015 | Frederick, Jr. et al. |
| 9,026,975 | B2 | 5/2015 | Song et al. |

(Continued)

*Primary Examiner* — Suchin Parihar
(74) *Attorney, Agent, or Firm* — Volentine, Whitt & Francos, PLLC

(57) ABSTRACT

A method of designing a semiconductor device includes preparing a standard cell layout including a layout out a preliminary pin pattern in at least one interconnection layout, performing a routing step to connect the preliminary pin pattern to a high-level interconnection layout, and generating a pin pattern in the interconnection layout, based on hitting information obtained at the completion of the routing step. The pin pattern is smaller than the preliminary pin pattern.

19 Claims, 25 Drawing Sheets

(56) References Cited

U.S. PATENT DOCUMENTS

2004/0221253 A1 11/2004 Imper et al.
2013/0042216 A1 2/2013 Loh et al.
2015/0143309 A1* 5/2015 De Dood ............ G06F 17/5068
　　　　　　　　　　　　　　　　　　　　716/107

* cited by examiner

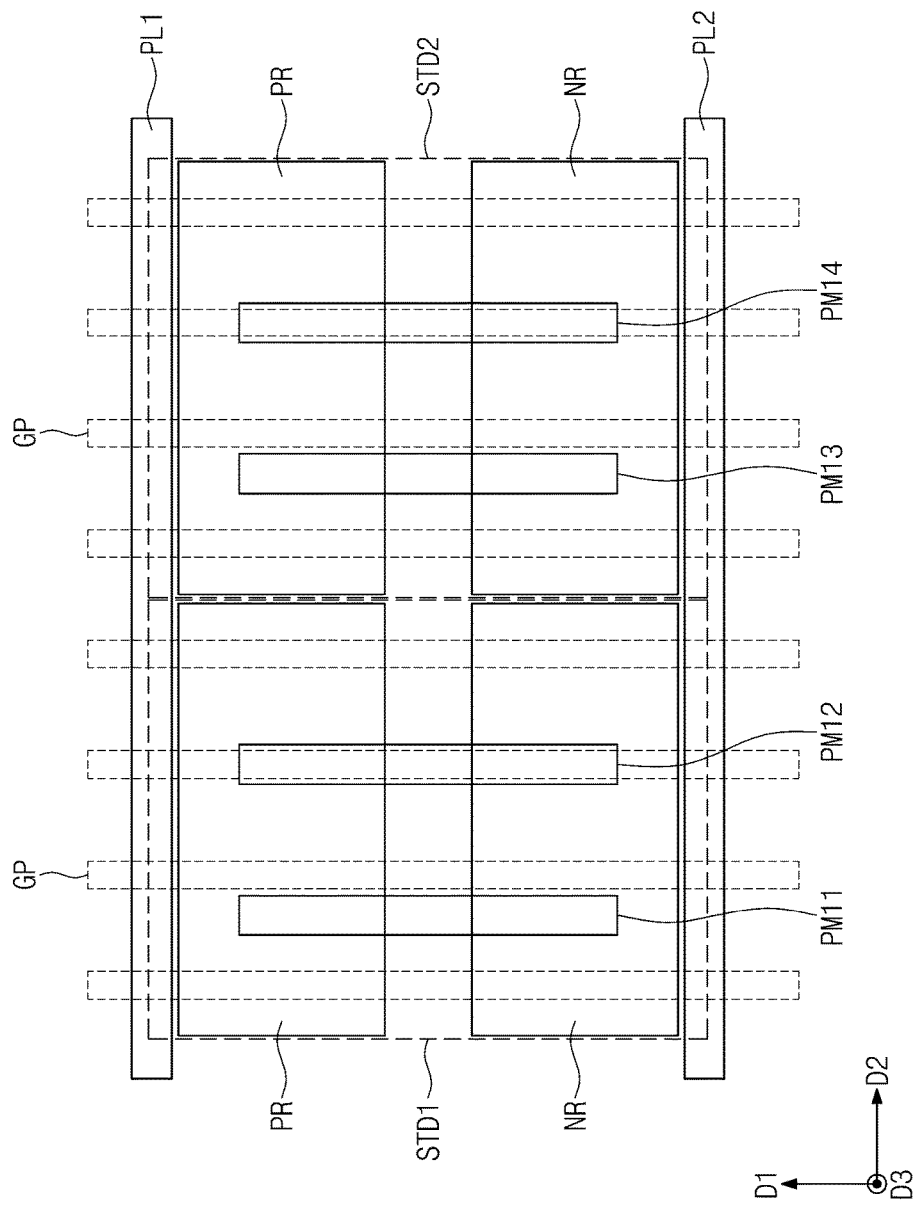

METHODS OF DESIGNING A LAYOUT OF A SEMICONDUCTOR DEVICE INCLUDING FIELD EFFECT TRANSISTOR AND METHODS OF MANUFACTURING A SEMICONDUCTOR DEVICE USING THE SAME

PRIORITY STATEMENT

This is a Continuation of U.S. application Ser. No. 15/184,227, filed Jun. 16, 2016, in which a U.S. non-provisional patent application claims priority under 35 U.S.C. § 119 to Korean Patent Applications No. 10-2015-0108171 and No. 10-2015-0157565, filed on Jul. 30, 2015 and Nov. 10, 2015, in the Korean Intellectual Property Office, the entire contents of which are hereby incorporated by reference.

BACKGROUND

The inventive concept relates to the interconnections, such as metal lines and vias, of active elements a semiconductor device. More particularly, the inventive concept relates to a method of designing a layout of a semiconductor device including field effect transistors and to a method of manufacturing a semiconductor device using the same.

Due to their small-sized, multifunctional, and/or low-cost characteristics, semiconductor devices are esteemed in the electronics industry. Semiconductor devices may be classified as memory devices for storing data, logic devices for processing data, or hybrid devices including both of memory and logic elements. To meet an ever-increasing demand for electronic devices which operate at high speeds and/or consume low amounts of power, it is necessary to produce semiconductor devices that offer high performance and/or are multi-functional and yet remain highly reliable. To satisfy these technical requirements, the complexity and/or integration density of semiconductor devices is/are being increased.

SUMMARY

According to the inventive concept, there is provided a method of producing a layout of a semiconductor device, including providing a standard cell layout, the providing of the standard cell layout comprising creating a preliminary pin pattern of an interconnection layout of the standard cell layout, performing a routing step to produce a high-level interconnection layout in which a the preliminary pin pattern is connected to a high-level interconnection pattern, and generating a postliminary pin pattern in a region of the interconnection layout of the standard cell layout, based on hitting information obtained upon the completion of the routing step, and in which the postliminary pin pattern is smaller than the preliminary pin pattern.

According to the inventive concept, there is also provided a method of designing a layout of a semiconductor device may include providing a first standard cell layout and a second standard cell layout in a cell library, the providing of the first and second standard cell layouts including laying out a first preliminary pin pattern and a second preliminary pin pattern on the first and second standard cell layouts, respectively, laying out the first and second standard cell layouts, performing a routing step to connect the first and second preliminary pin patterns to high-level interconnection layouts, and generating a first pin pattern and a second pin pattern using the first and second preliminary pin patterns, respectively, based on hitting information to be obtained after the routing step. The first and second preliminary pin patterns may be the same as each other in terms of size and arrangement, and the first and second pin patterns may be different from each other in terms of size and arrangement.

According to the inventive concept, there is also provided a method of fabricating a semiconductor device, including a process of generating a layout of a semiconductor device, the layout comprising a standard cell layout, manufacturing a photomask having a mask pattern based on the layout of the semiconductor device, and forming layers of metal lines and vias on a substrate using the photomask, the vias vertically connecting different layers of the metal lines, and in which the generating of the layout of the semiconductor device comprises: laying out a lower via pattern on a logic layout of the standard cell layout, laying out a preliminary pin pattern on the lower via pattern, performing a routing step on the standard cell layout, which places a high-level interconnection layout and an upper via pattern on the preliminary pin pattern, the upper via pattern connecting the preliminary pin pattern to an element of the high-level interconnection layout, and generating a postliminary pin pattern connecting the lower via pattern to the upper via pattern, wherein the postliminary pin pattern and the preliminary pin pattern occupy overlapping regions in the process.

According to the inventive concept, there is also provided a method of fabricating a semiconductor device, including a process of generating a device layout of a semiconductor device, and manufacturing a semiconductor device using the device layout. The process of generating the device layout includes: acquiring a standard cell layout that includes a layout of active elements and/or regions of the semiconductor device, and an interconnection layout including a preliminary pin pattern defining a region in the semiconductor device containing a location of a lower via to be electrically connected to at least one of the active components and/or regions, performing a routing step comprising overlaying a high-level interconnection pattern and an upper via pattern on the standard cell layout, wherein the high-level interconnection pattern intersects the preliminary pin pattern and is representative of a high-level interconnection of the semiconductor device, and the upper via pattern is placed at the intersection of the high-level interconnection pattern and the preliminary pin pattern and represents the location of an upper via of the semiconductor device, producing hitting information indicative of the location of the upper via based on the routing step, and using the hitting information to produce a postliminary pin pattern representative of a region in the semiconductor device containing both the lower via and the upper via. The manufacturing of the semiconductor device comprises: forming active elements and/or regions at an upper part of a substrate as laid out based on the standard cell layout, forming layers of metal lines one above another on the substrate, and forming vias connecting the layers of metal lines to the active components, wherein the layers of metal lines comprise a lower level metal layer including a lower level metal interconnection corresponding to the postliminary pin pattern and an upper level metal layer including an upper level metal interconnection corresponding to the high-level interconnection, and the vias include a first via corresponding to the lower via and interposed between and electrically connecting the lower level metal interconnection to at least one of the active components, and a second via corresponding to the upper via and interposed between and electrically connecting the lower level and upper level metal interconnections.

BRIEF DESCRIPTION OF THE DRAWINGS

The inventive concept will be more clearly understood from the following detailed description of non-limiting examples thereof taken in conjunction with the accompanying drawings.

FIGS. 11A and 11B are plan views illustrating a method of laying out a standard cell and establishing a routing structure therefor, according to some examples of the inventive concept.

Figure 1:
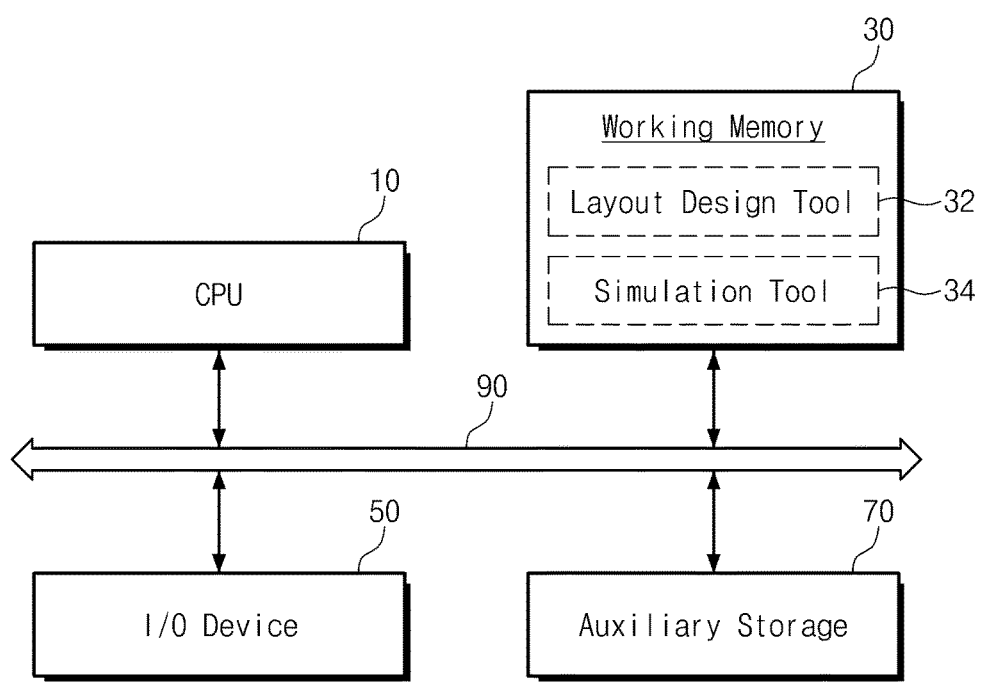
FIG. 1 is a block diagram illustrating a computer system for performing a semiconductor design process, according to some examples of the inventive concept.

It should be noted that these figures are intended to illustrate the general characteristics of methods, structure and/or materials utilized in certain examples and to supplement the written description provided below. These drawings are not, however, to scale and may not precisely reflect the precise structural or performance characteristics of any given example, and should not be interpreted as defining or limiting the range of values or properties encompassed by the inventive concept. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which examples of the inventive concepts are shown. The inventive concept may, however, be embodied in different forms and should not be constructed as limited to the examples set forth herein. Rather, these examples are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. The same is true for similar terms such as "interposed between". In contrast, the term "directly" means that there are no intervening elements. Additionally, the example in the detailed description will be described with sectional views as ideal exemplary views of the inventive concepts. Accordingly, shapes of the exemplary views may be modified according to manufacturing techniques and/or allowable errors. Therefore, the examples of the inventive concepts are not limited to the specific shapes illustrated in the exemplary views, but may include other shapes that may be created according to manufacturing processes.

Other terminology used herein for the purpose of describing particular examples or embodiments of the inventive concept is to be taken in context. For example, the terms "comprises" or "comprising" when used in this specification specifies the presence of stated features or processes or steps but does not preclude the presence or additional features or processes or steps. Other terms are to be taken in context. For example, the term "size" of a region or pattern will generally be understood from the context as referring to the area of the region or pattern as viewed in plan, i.e., it's footprint, and may refer to the length of the region or pattern when comparing two regions or patterns of similar widths. The term "position" may refer to the relative location of, for example, a region or pattern in a layout. Further in this respect, although at times terms such as "connecting" or "connected to" may be used in describing a method of producing or designing a layout, it will be understood that these terms are being used to refer to connections in a virtual sense seeing that the layout process does not entail any physical or electrical connecting of actual elements and/or regions.

Aspects of the present inventive concepts explained and illustrated herein include their complementary counterparts. The same reference numerals or the same reference designators denote the same elements throughout the drawings.

FIG. 1 is a block diagram illustrating a computer system for performing examples of a semiconductor design process, according to the inventive concept. Referring to FIG. 1, a computer system may include a central processing unit (CPU) 10, a working memory 30, an input-output device 50, and a storage device 70. In some examples, the computer system may be a customized system for performing a layout design process according to the inventive concept. Furthermore, the computer system may include a computing system configured to execute various design and check simulation programs.

The CPU 10 may be configured to run a variety of software, such as application programs, operating systems, and device drivers. For example, the CPU 10 may be configured to run an operating system (not shown) loaded onto the working memory 30. Furthermore, the CPU 10 may be configured to run various application programs on the operating system. For example, the CPU 10 may be configured to run a layout design tool 32 loaded onto the working memory 30.

The operating system or application programs may be loaded in the working memory 30. For example, when the computer system starts a booting operation, an OS image (not shown) stored in the storage device 70 may be loaded onto the working memory 30 according to a booting sequence. In the computer system, overall input/output operations may be managed by the operating system. Similarly, some application programs, which may be selected by a user or be provided for basic services, may be loaded onto the working memory 30. According to some examples of the inventive concept, the layout design tool 32 prepared for a layout design process may be loaded onto the working memory 30 from the storage device 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the biasing data. The working memory 30 may comprise a volatile memory device (e.g., a static random access memory (SRAM) or dynamic random access memory (DRAM) device) or nonvolatile memory device (e.g., a PRAM, MRAM, ReRAM, FRAM, or NOR FLASH memory device).

In addition, a simulation tool 34 may be loaded onto the working memory 30 to perform an optical proximity correction (OPC) operation on the designed layout data.

The input-output device 50 may be configured to control user input and output operations of user interface devices. For example, the input-output device 50 may include a keyboard or a monitor, allowing a designer to input relevant information. By using the input-output device 50, the designer may receive information on several regions or data paths, to which adjusted operating characteristics will be applied, of a semiconductor device. The input-output device 50 may be configured to display a progress status or a process result of the simulation tool 34.

The storage device 70 may serve as a storage medium for the computer system. The storage device 70 may be configured to store application programs, an OS image, and various data. The storage device 70 may comprise a memory card (e.g., an MMC, eMMC, SD, MicroSD, or the like) or a hard disk drive (HDD). The storage device 70 may include a NAND FLASH memory device with a large memory capacity. Alternatively, the storage device 70 may include at least one next-generation nonvolatile memory device (e.g., a PRAM, MRAM, ReRAM, or FRAM) or NOR FLASH memory device.

A system interconnector 90 may serve as a system bus for allowing a network to be created in the computer system. The CPU 10, the working memory 30, the input-output device 50, and the storage device 70 may be electrically connected to each other through the system interconnector 90, and thus, data may be exchanged therebetween. However, the system interconnector 90 may not be limited to consisting of merely a bus; rather, it may include an additional element for increasing efficiency in data communication.

Figure 2:
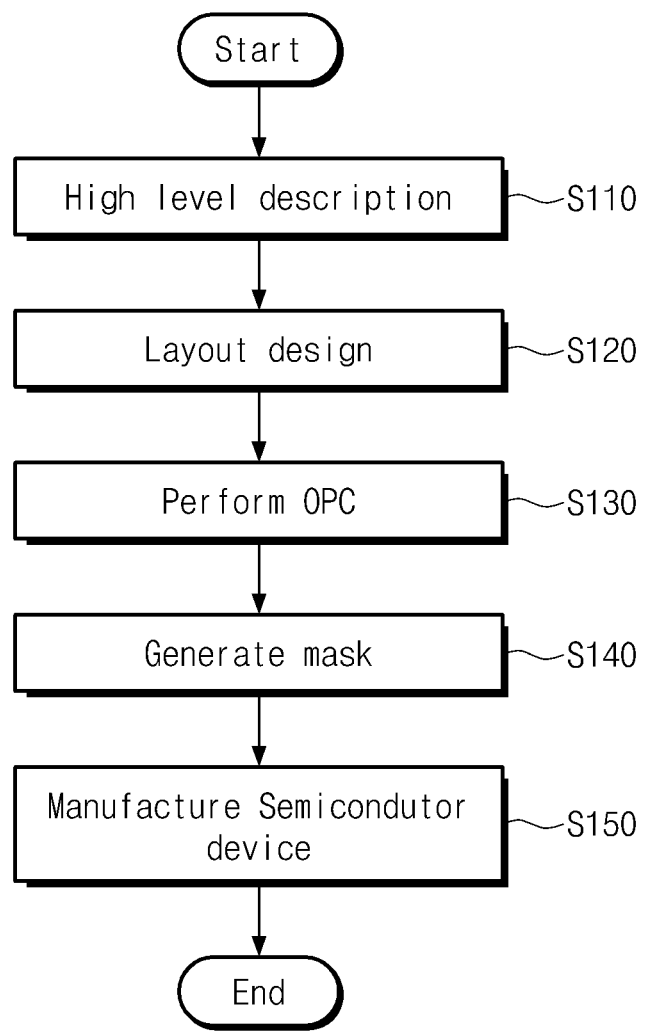
FIG. 2 is a flow chart illustrating a method of designing and manufacturing a semiconductor device, according to some examples of the inventive concept.

FIG. 2 is a flow chart illustrating a method of designing and manufacturing a semiconductor device, according to some examples of the inventive concept.

Referring to FIG. 2, a high-level design process for a semiconductor integrated circuit may be performed using the computer system described with reference to FIG. 1 (S110). For example, in the high-level design process, an integrated circuit to be designed may be described in terms of high-level computer language (e.g., C language). Circuits designed by the high-level design process may be more concretely described by a register transfer level (RTL) coding or a simulation. Furthermore, codes generated by the RTL coding may be converted into a netlist, and the results may be combined with each other to produce a schematic of all of the circuitry of a semiconductor device. The (operability or practicality of the semiconductor device represented by the) schematic may be verified by a simulation tool. In certain examples, an adjusting step may be further performed, in consideration of a result of the verification step.

A layout design process may be performed to realize a logically complete form of the semiconductor integrated circuit on a silicon wafer (S120). For example, the layout design process may be performed, based on the schematic circuit prepared in the high-level design process or the corresponding netlist. The layout design process may include a routing step of laying out and connecting various standard cells that are provided from a cell library, based on a predetermined design rule. In the layout design process according to some examples of the inventive concept, pin patterns may be formed in each of the standard cells, based on hitting information obtained after the routing step.

The cell library may contain information on operation, speed, and power consumption of cells. In certain examples, a cell library of representations of a layout of a circuit in a gate level may be provided in or defined by the layout design tool. Here, the layout may be prepared to define or describe shapes, positions, or dimensions of patterns constituting transistors and metal lines, which will actually be formed on a silicon wafer. For example, in order to actually form an inverter circuit on a silicon wafer, it may be necessary to prepare or draw a layout of certain patterns (e.g., those of a PMOS, NMOS, N-WELL, gate electrodes, and metal lines thereon). For this, at least one of inverters in the cell library may be selected. Thereafter, a routing step of connecting the selected cells to each other may be performed. These steps may be automatically or manually performed in the layout design tool. In certain examples, a step of laying out the standard cells and establishing routing structures thereto may be automatically performed by a Place & Routing tool.

After the routing step, a verification step may be performed on the layout to check whether any portion of the schematic circuit violates the given design rule. In some examples, the verification step may include evaluating verification items, such as a design rule check (DRC), an electrical rule check (ERC), and a layout vs. schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (S130). The OPC step may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposure process using the photomask manufactured based on the layout. In the OPC step, the layout may be modified to have a reduced difference in shape between designed patterns and actually-formed patterns, which difference would otherwise be caused by the optical proximity effects. As a result of the optical proximity correction step, the designed shapes and positions of the layout patterns may be slightly changed.

A photomask may be manufactured, based on the layout modified by the OPC step (S140). In general, the photomask may be manufactured by patterning a chromium layer provided on a glass substrate, using the layout pattern data.

The photomask may be used to manufacture a semiconductor device (S150). In the actual manufacturing process, the exposure and etching steps may be repeatedly performed, and thus, patterns defined in the layout design process may be sequentially formed on a semiconductor substrate.

Figure 3:
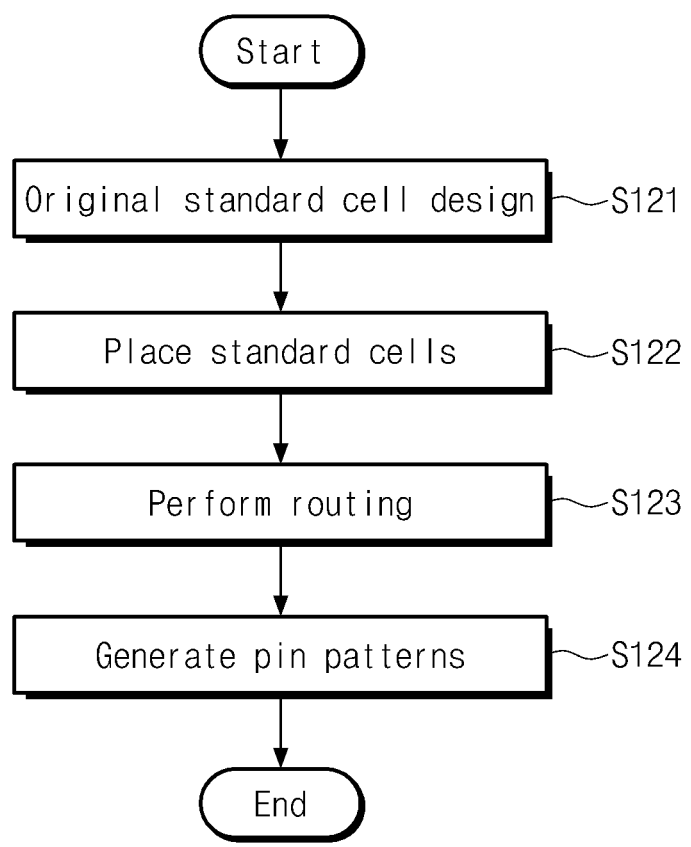
FIG. 3 is a flow chart illustrating some steps of the layout design of FIG. 2.

FIG. 3 is a flow chart illustrating some steps of the layout design process of the method of FIG. 2. FIGS. 4A, 4B, 5A, and 5B are plan views illustrating a method of laying out a standard cell and establishing a routing structure therefor.

Figure 4A:
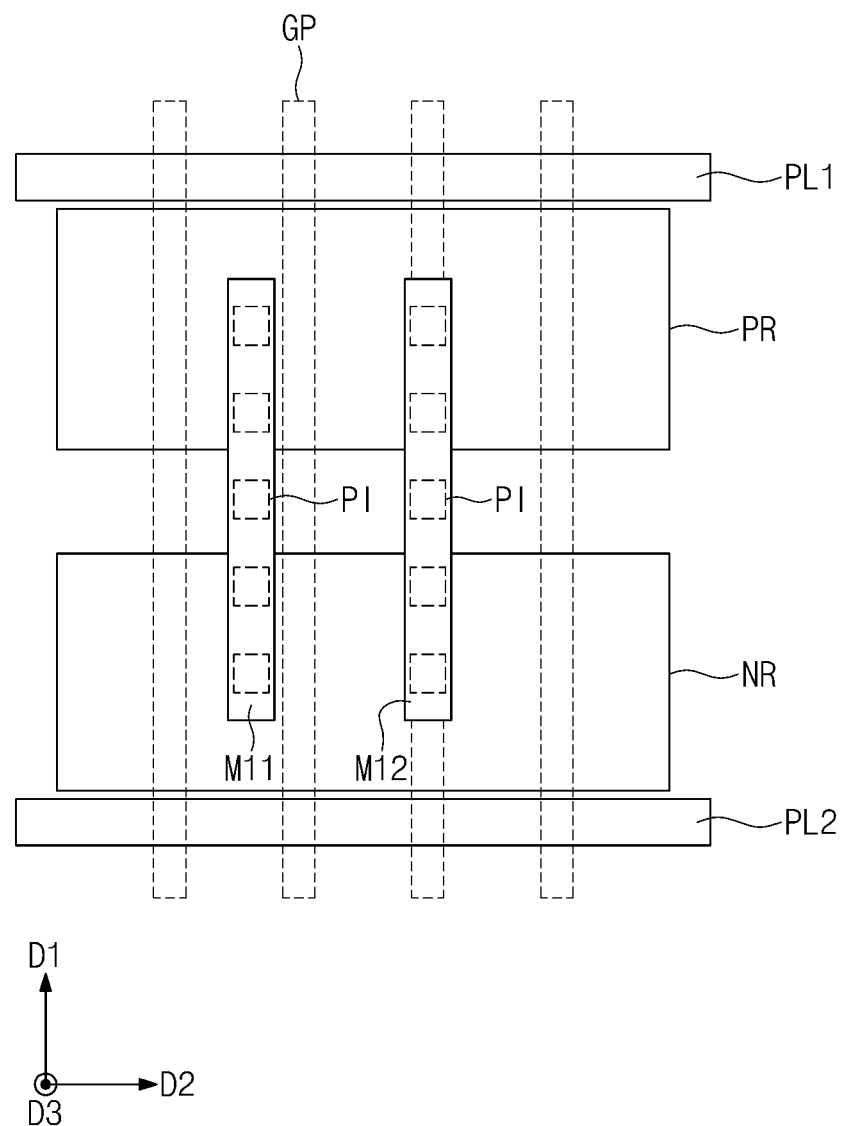
FIGS. 4A, 4B, 5A, and 5B are plan views illustrating methods of laying out standard cells and establishing routing structures therefor, for use in explaining some advantages and benefits of methods according to the inventive concept.

Referring to FIGS. 3 and 4A, an original standard cell layout may be provided using a layout design tool (S121). The standard cell layout may include a logic layout representative of a layout of logic transistors and an interconnection layout. For example, the interconnection layout of FIG. 4A may correspond to a first metal layer to be provided on a semiconductor substrate.

In more detail, the providing of the logic layout may include providing a layout of active regions. The active regions may include a PMOSFET region PR and an NMOSFET region NR. The PMOSFET region PR and the NMOSFET region NR may be spaced apart from each other in a first direction D1.

The providing of the logic layout may also include providing a layout of gate patterns GP crossing the PMOSFET region PR and the NMOSFET region NR and extending in the first direction D1. The gate patterns GP may be spaced apart from each other in the second direction D2 crossing the first direction D1. The PMOSFET region PR, the NMOSFET region NR, and the gate patterns GP may constitute the logic transistors to be provided on the semiconductor substrate.

The providing of the interconnection layout may include providing first and second power patterns PL1 and PL2 and first and second pin patterns M11 and M12. Each of the first and second power patterns PL1 and PL2 may be a line-shaped pattern extending parallel to the second direction D2, and each of the first and second pin patterns M11 and M12 may be a line-shaped pattern extending parallel to the first direction D1. The first and second pin patterns M11 and M12 may be spaced apart from each other in the second direction D2.

Each of the first and second pin patterns M11 and M12 may include pin regions PI for routing with a high-level interconnection layout, which will be described below. For example, each of the first and second pin patterns M11 and M12 may include five pin regions PI.

The standard cell layout may be saved in the cell library described with reference to FIG. 2. Next, multiple ones of the standard cell layout saved in the cell library may be set in place (S122). Although a single standard cell layout is illustrated in FIG. 4A, a plurality of standard cell layouts may be set in place as aligned with each other in the second direction D2 (e.g., see FIG. 11A).

Figure 4B:
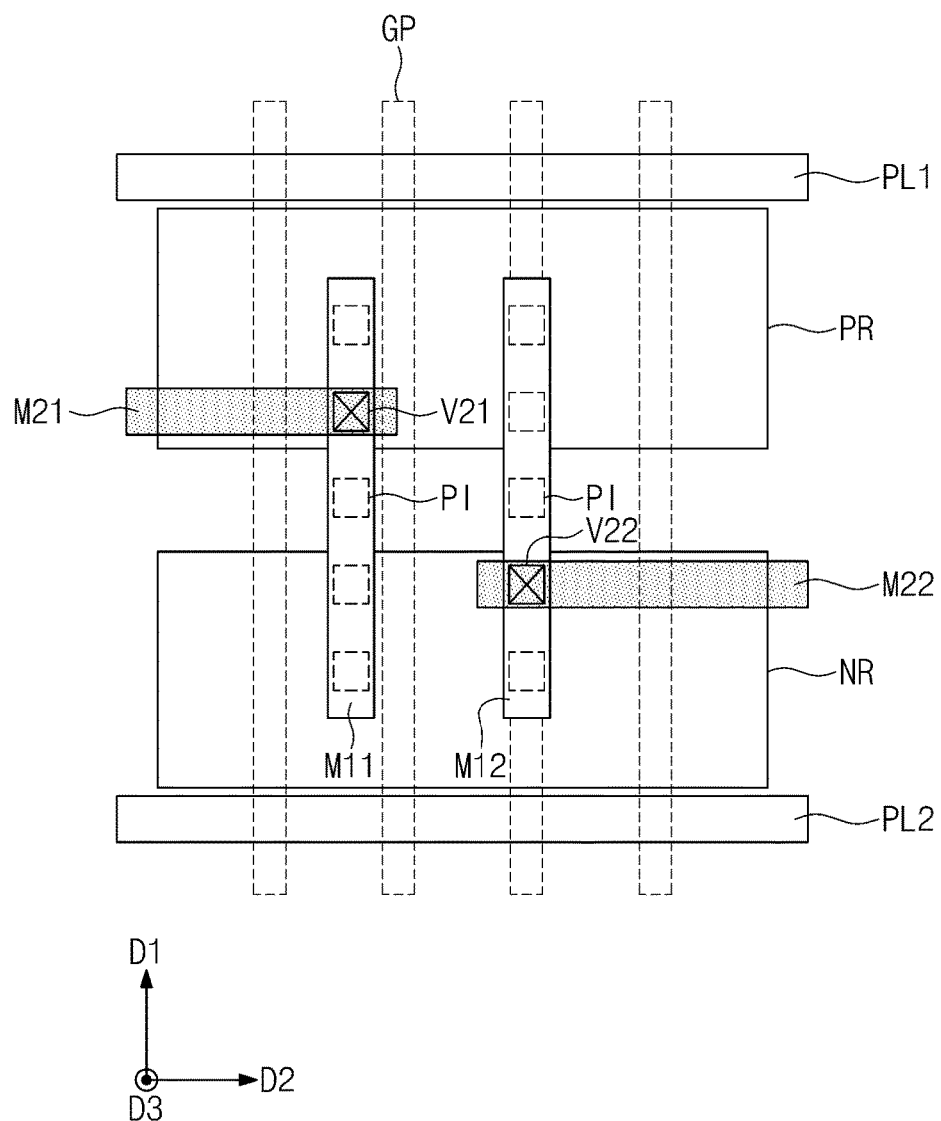

Referring to FIGS. 3 and 4B, a routing step may be performed on the standard cell layout to connect the standard cell to the high-level interconnection layout (S123). Firstly, the high-level interconnection layout may be provided. The high-level interconnection layout may correspond to a second metal layer to be formed on the semiconductor substrate. In certain examples, although not shown, the high-level interconnection layout may correspond to a plurality of metal layers that will be sequentially stacked on the semiconductor substrate.

The providing of the high-level interconnection layout may include laying out first and second interconnection patterns M21 and M22 and laying out first and second upper via patterns V21 and V22. The first and second interconnection patterns M21 and M22 may be automatically set in place in consideration of their connection to other standard cell layouts, and in certain examples, this step may be performed using the layout design tool and/or the Place & Routing tool. Each of the first and second interconnection patterns M21 and M22 may be a line-shaped pattern extending parallel to the second direction D2.

The laying out of the first and second upper via patterns V21 and V22 may be performed at the same time as or after the first and second interconnection patterns M21 and M22 are laid out. The first upper via pattern V21 may be provided on one of the pin regions PI of the first pin pattern M11 overlapped with the first interconnection pattern M21. The second upper via pattern V22 may be provided on one of the pin regions PI of the second pin pattern M12 overlapped with the second interconnection pattern M22. In other words, the interconnection layout of the standard cell layout may be connected to the interconnection patterns of the high-level interconnection layout through the first and second upper via patterns V21 and V22.

Since the routing of the standard cell layout described with reference to FIGS. 4A and 4B is performed using the first and second pin patterns M11 and M12, each of which includes the plurality of pin regions PI, it is possible to increase a degree of freedom in the routing step. For example, regardless of its position, each of the first and second interconnection patterns M21 and M22 may be overlapped with at least one of the pin regions PI, and thus, each of the first and second interconnection patterns M21 and M22 may be easily connected to the first and second pin patterns M11 and M12. The routing for a standard cell layout, in which pin patterns with other shapes are provided, will be described in below.

Figure 5A:
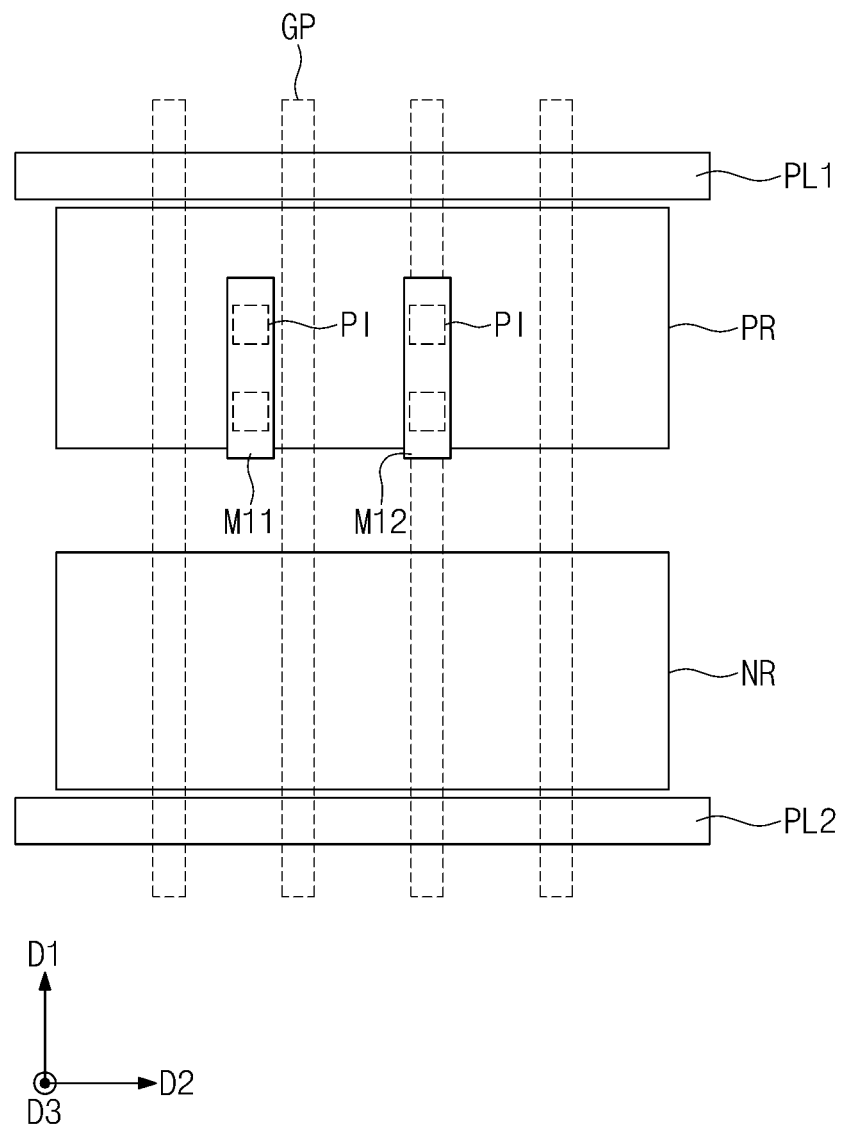

Referring to FIGS. 3 and 5A, in a different example, an original standard cell layout may be provided using the layout design tool (in S121). In more detail, an interconnection layout may be provided, and the providing of the interconnection layout may include laying out the first and second power patterns PL1 and PL2 and laying out the first and second pin patterns M11 and M12. In this example, each of the first and second pin patterns M11 and M12 may have two pin regions PI, unlike that described with reference to FIGS. 4A and 4B. In other words, each of the first and second pin patterns M11 and M12 may be smaller than that described with reference to FIGS. 4A and 4B. Next, multiple ones of the standard cell layout saved in the cell library may be set in place relative to each other (S122).

Figure 5B:
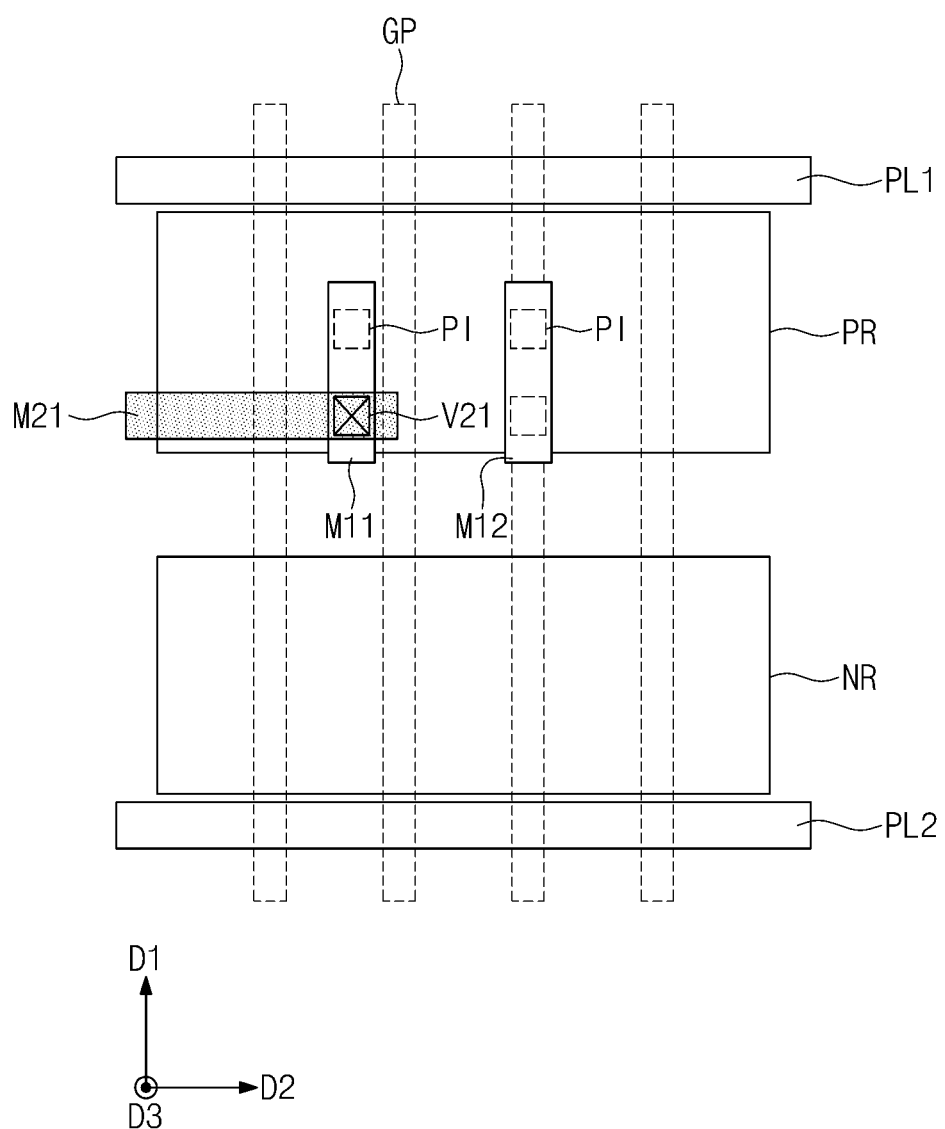

Referring to FIGS. 3 and 5B, a routing step may be performed on the standard cell layout to connect the standard cell to the high-level interconnection layout (S123). The providing of the high-level interconnection layout may include laying out the first interconnection pattern M21 and laying out the first upper via pattern V21. Unlike that described with reference to FIG. 4B, the second interconnection pattern M22 is not be provided. This is because the relatively small size of the second pin pattern M12 may make it difficult to overlap the second pin pattern M12 with the second interconnection pattern M22 and consequently, in connecting the second pin pattern M12 to the second interconnection pattern M22.

The routing of the standard cell layout described with reference to FIGS. 5A and 5B has a lower degree of freedom, compared with that shown in and described with reference to FIGS. 4A and 4B. This is because the first and second pin patterns M11 and M12 are smaller than those shown in and described FIGS. 4A and 4B.

Because the first and second pin patterns M11 and M12 are relatively small, though, they may have low parasitic capacitance, and this makes it possible to realize a semiconductor device that has high operation speed and low power consumption characteristics. By contrast, the relatively large first and second pin patterns M11 and M12 described with reference to FIGS. 4A and 4B have high parasitic capacitance, and this is an impediment to increasing the operation speed and reducing the power consumption of a semiconductor device.

Figure 6A:
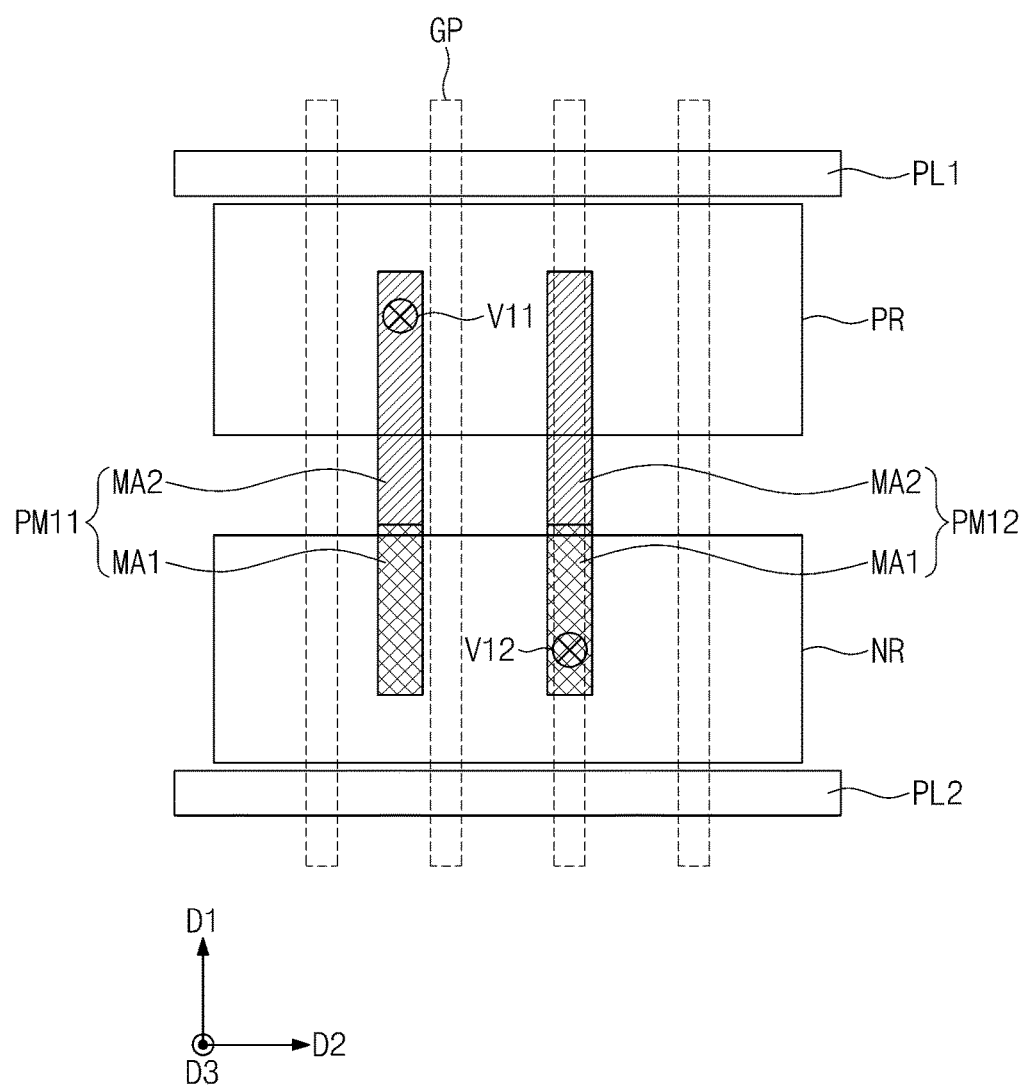
FIGS. 6A, 6B and 6C are plan views illustrating a method of laying out a standard cell and establishing a routing structure therefor, according to some examples of the inventive concept.
Figure 6B:
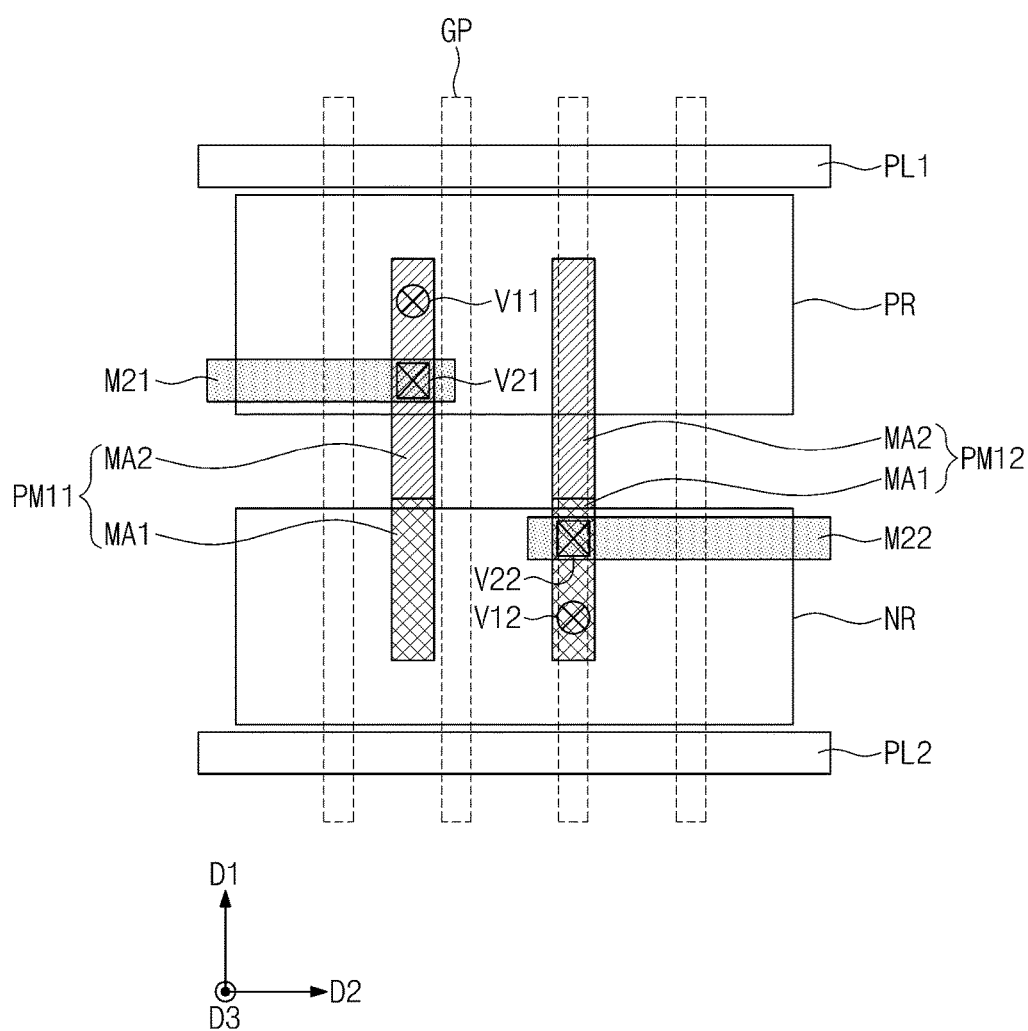
Figure 6C:
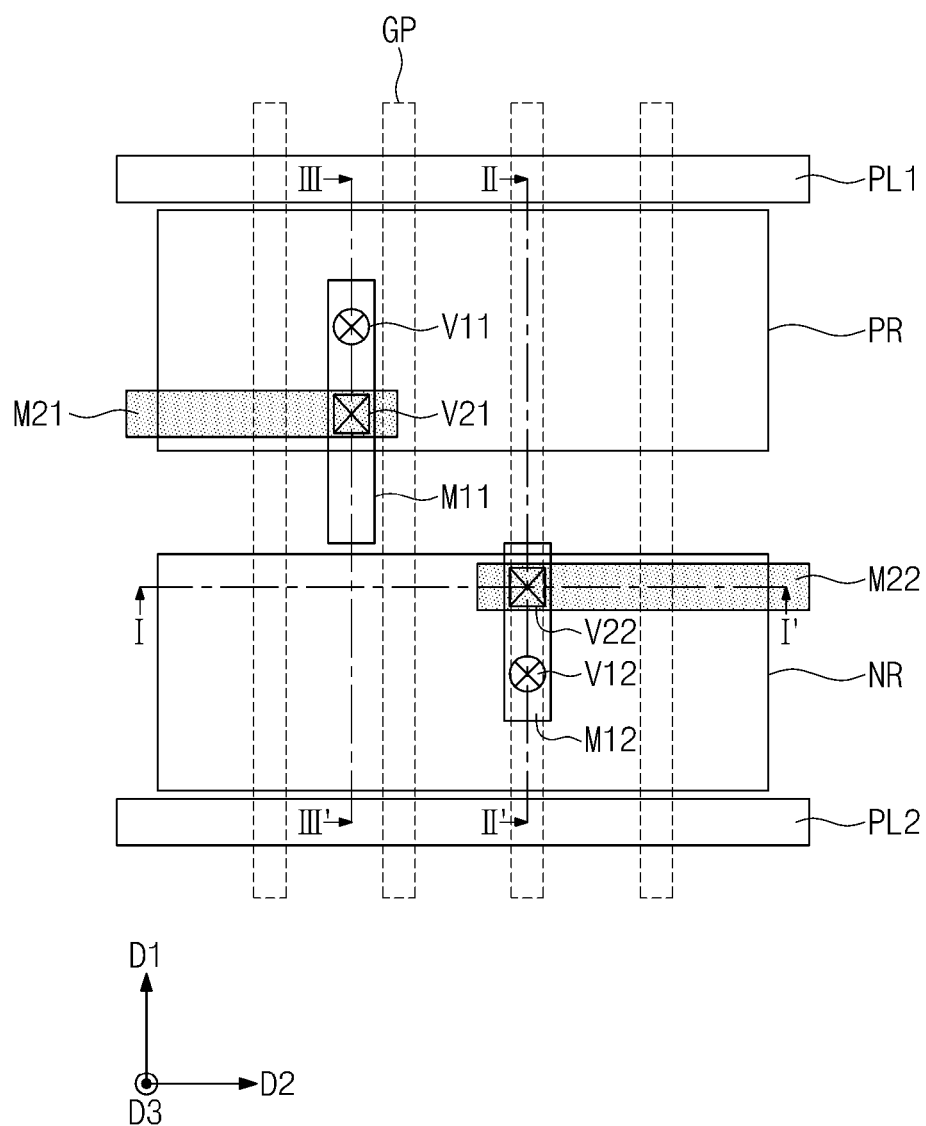

FIGS. 6A to 6C are plan views illustrating a method of laying out a standard cell and establishing a routing structure therefor, according to some examples of the inventive concept. In the following description, an element or step previously described with reference to FIGS. 4A, 4B, 5A, and 5B may be identified by a similar or identical reference number so as to avoid the necessity of duplicating a description thereof.

Referring to FIGS. 3 and 6A, an original standard cell layout may be provided using the layout design tool (S121). In more detail, an interconnection layout may be provided, and the providing of the interconnection layout may include laying out the first and second power patterns PL1 and PL2 and laying out first and second preliminary pin patterns PM11 and PM12. Furthermore, the providing of the interconnection layout may include laying out first and second lower via patterns V11 and V12 for connecting the logic layout to the first and second preliminary pin patterns PM11 and PM12, respectively.

Each of the first and second preliminary pin patterns PM11 and PM12 may include a first ghost pattern MA1 and a second ghost pattern MA2. The first and second ghost patterns MA1 and MA2 may be used to define positions of pin patterns, which will be established in a subsequent step; that is, the first and second ghost patterns MA1 and MA2 may serve as markers.

The first and second ghost patterns MA1 and MA2 may be in direct contact with each other and may constitute the preliminary pin patterns PM11 and PM12. The first and second ghost patterns MA1 and MA2 may be different from, or equal to, each other in terms of size. In some examples, the first ghost pattern MA1 may be smaller than the second ghost pattern MA2. Here, the first ghost pattern MA1 may have a process margin or a minimum feature size that is determined by technical limitations in subsequent photolithography and etching processes.

The standard cell layout may be saved in the cell library described with reference to FIG. 2. Next, multiple ones of the standard cell layout saved in the cell library may be set in place (S122). Although a single standard cell layout is illustrated in FIG. 6A, a plurality of standard cell layouts may be set in place as aligned in the second direction D2 and parallel to each other (e.g., see FIG. 11A).

Referring to FIGS. 3 and 6B, a routing step may be performed on the standard cell layout to connect the standard cell to the high-level interconnection layout (S123). The providing of the high-level interconnection layout may include laying out the first and second interconnection patterns M21 and M22 and laying out the first and second upper via patterns V21 and V22. The first and second interconnection patterns M21 and M22 and the first and second upper via patterns V21 and V22 may be automatically laid out in consideration of the interconnection between them and another standard cell layout.

Each of the first and second upper via patterns V21 and V22 may be placed on a corresponding one of overlapping regions of the first and second preliminary pin patterns PM11 and PM12 and the first and second interconnection patterns M21 and M22, respectively. In more detail, the first upper via pattern V21 may be placed on the second ghost pattern MA2 of the first preliminary pin pattern PM11, and the second upper via pattern V22 may be placed on the first ghost pattern MA1 of the second preliminary pin pattern PM12. Positions of the first and second upper via patterns V21 and V22 may be contained in hitting information generated at the completion of the routing step.

Referring to FIGS. 3 and 6C, the first and second pin patterns M11 and M12 may be provided or generated in the interconnection layout, based on the hitting information (in S124). In more detail, the second ghost pattern MA2 of the first preliminary pin pattern PM11 may be converted into the first pin pattern M11, and the first ghost pattern MA1 of the second preliminary pin pattern PM12 may be converted into the second pin pattern M12. In other words, one of the ghost patterns MA1 and MA2 may be converted into the pin pattern, and the other of the ghost patterns MA1 and MA2 may be removed.

The first and second lower via patterns V11 and V12 may be connected to the first and second upper via patterns V21 and V22, respectively, through the first and second pin patterns M11 and M12. In other words, the first and second pin patterns M11 and M12 may allow an input or output signal to be applied to the logic layout therethrough.

Although not shown, in another example according to the inventive concept, the second lower via pattern V12 is placed below the second ghost pattern MA2 of the second preliminary pin pattern PM12, and both of the first and second ghost patterns MA1 and MA2 are converted into the second pin pattern M12 so as to connect the second lower via pattern V12 to the second upper via pattern V22.

According to the above-described routing of the standard cell layout, it is possible to maximize the degree of freedom in the routing step, as described with reference to FIGS. 4A and 4B, and to minimize the size of the pin pattern, as described with reference to FIGS. 5A and 5B. This may make it possible to improve performance and power consumption characteristics of a semiconductor device.

Figure 7A:
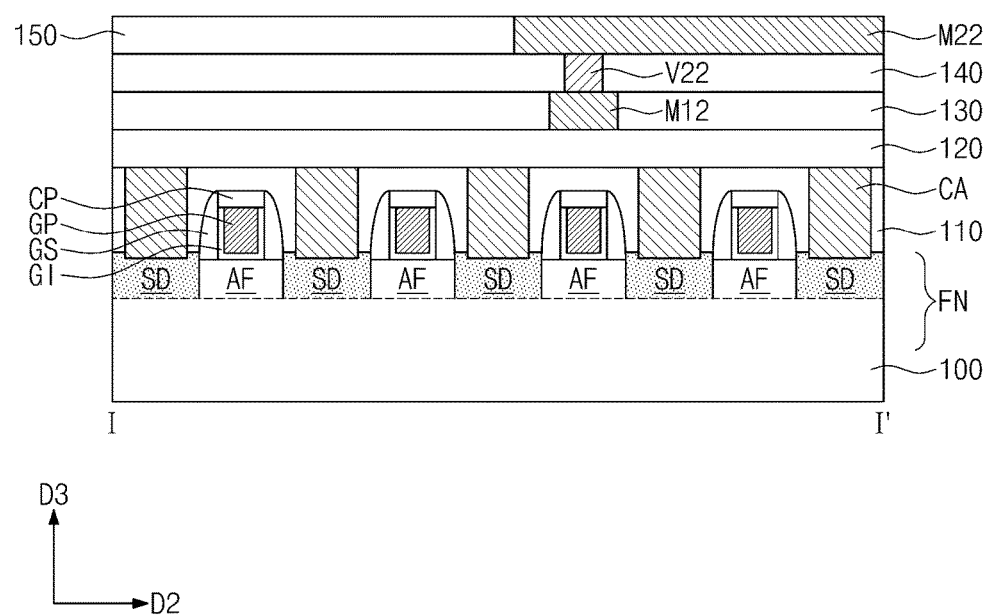
FIGS. 7A, 7B and 7C are sectional views, which are taken along lines I-I', and respectively, of FIG. 6C to illustrate a semiconductor device according to some examples of the inventive concept.
Figure 7B:
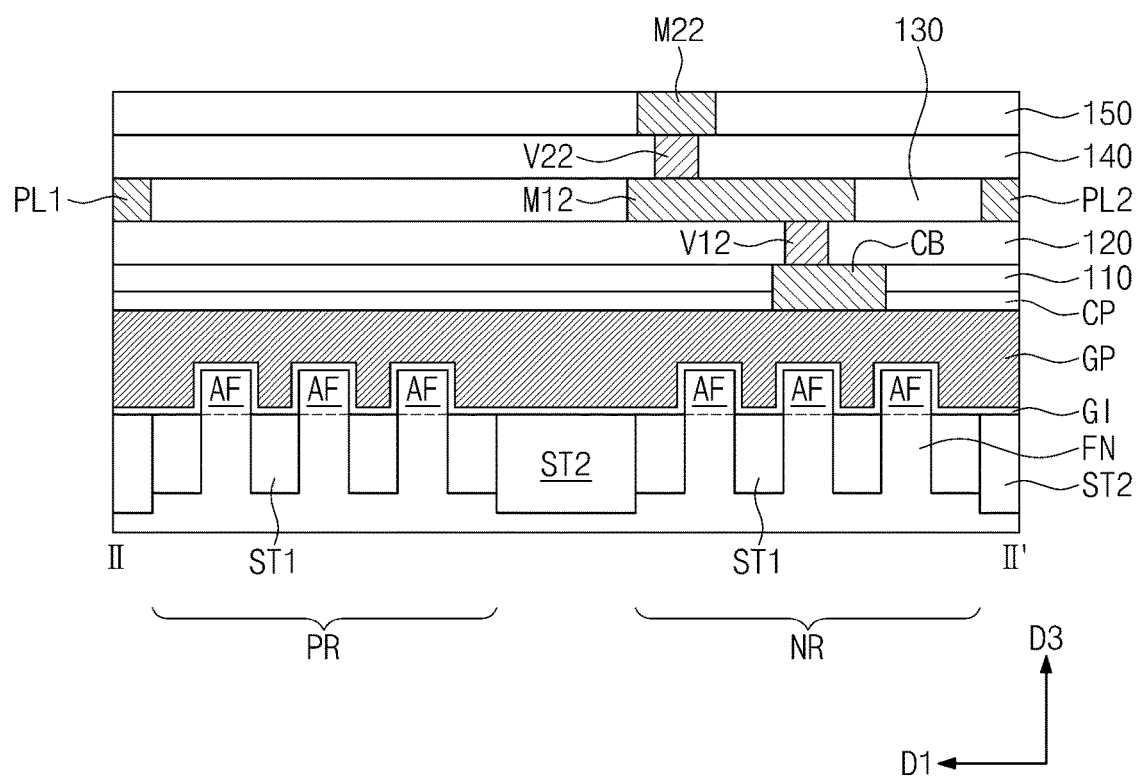
Figure 7C:
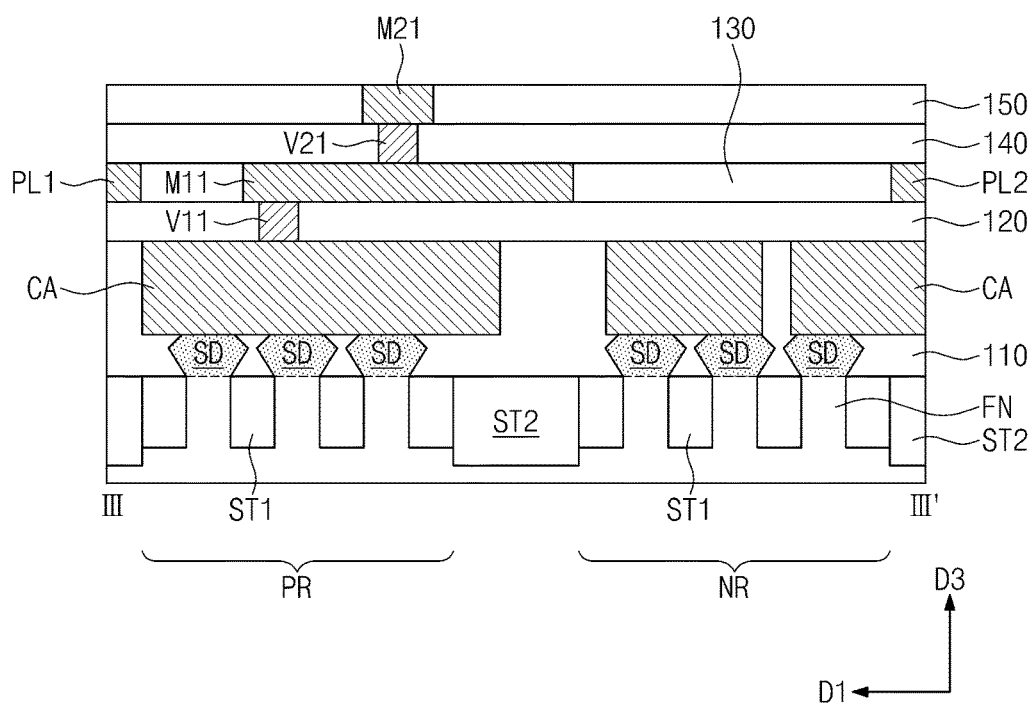

FIGS. 7A to 7C illustrate a semiconductor device manufactured according to the inventive concept. For example, the standard cell layout previously described with reference to FIG. 6C may be used to fabricate semiconductor devices, and FIGS. 7A to 7C illustrate an example of such a semiconductor device.

In the following description of FIGS. 7A to 7C, elements corresponding to those of the above-described standard cell layout will be designated by the same numerals. However, such elements constituting a semiconductor device may be formed on a semiconductor substrate using a photolithography process, and thus, they may not be identical to corresponding patterns constituting the standard cell layout.

In some examples, the semiconductor device is provided in the form of a system-on-chip.

Referring to FIGS. 6C and 7A to 7C, second device isolation layers ST2 may be provided on a substrate 100 to define PMOSFET and NMOSFET regions PR and NR. The second device isolation layers ST2 may be formed in a top portion of the substrate 100. The substrate 100 may be a silicon substrate, a germanium substrate, or a silicon-on-insulator (SOI) substrate.

The PMOSFET and NMOSFET regions PR and NR may be spaced apart from each other, in the first direction D1 parallel to a top surface of the substrate 100, by the second device isolation layers ST2 interposed therebetween. In some examples, each of the PMOSFET and NMOSFET regions PR and NR is a single (contiguous) region, but each of the PMOSFET and NMOSFET regions PR and NR may instead include a plurality of regions spaced apart from each other by the second device isolation layers ST2.

A plurality of active patterns FN may be provided at the upper part of the PMOSFET and NMOSFET regions PR and NR as extending linearly in the second direction D2 crossing the first direction D1. The active patterns FN may be parts of or patterns protruding from the substrate 100. The active patterns FN may be spaced from each other along the first direction D1. First device isolation layers ST1 may be provided at both sides of each of the active patterns FN as extending in the second direction D2. In some examples, each of the active patterns FN has a fin-shaped portion at an uppermost part thereof. As an example, the fin-shaped portion may be that part of the pattern FN protruding in an upward direction above the level of the first device isolation layers ST1.

The first and second device isolation layers ST1 and ST2 may be connected to each other in a substantially continuous manner, thereby forming a single insulating layer. In some examples, the second device isolation layers ST2 may have a thickness greater than that of the first device isolation layers ST1. In this case, the first device isolation layers ST1 may be formed by a process different from that for the second device isolation layers ST2. In certain examples, the first device isolation layers ST1 may be simultaneously formed using the same process as that for the second device isolation layers ST2, thereby having substantially the same thickness as that of the second device isolation layers ST2. The first and second device isolation layers ST1 and ST2 may be formed in the upper portion of the substrate 100. The first and second device isolation layers ST1 and ST2 may be constituted by, for example, a silicon oxide layer.

Gate patterns GP may be provided on the active patterns FN as extending across the active patterns FN in the first direction D1 and parallel to each other. The gate patterns GP may be spaced apart from each other in the second direction D2. More specifically, each of the gate patterns GP may extend parallel to the first direction D1 across the PMOSFET region PR, the second device isolation layers ST2, and the NMOSFET region NR.

A gate insulating pattern GI may be provided below each of the gate patterns GP, and gate spacers GS may be provided at both sides of each of the gate patterns GP. Furthermore, a capping pattern CP may be provided to cover a top surface of each of the gate patterns GP. However, in certain examples, the capping pattern CP may be removed from a portion of the top surface of the gate pattern GP connected to a gate contact CB. First to fifth interlayer insulating layers 110-150 may be provided to cover the gate patterns GP.

The gate patterns GP may be formed of or include at least one material selected from the group consisting of doped semiconductors, metals, and conductive metal nitrides. The gate insulating pattern GI may include at least one of a silicon oxide layer, a silicon oxynitride layer, and a high-k dielectric layer whose dielectric constant is higher than that of a silicon oxide layer. Each of the capping pattern CP and the gate spacers GS may include at least one of a silicon oxide layer, a silicon nitride layer, and a silicon oxynitride layer. Each of the first to fifth interlayer insulating layers 110-150 may be a silicon oxide layer or a silicon oxynitride layer.

Source/drain regions SD may be provided in portions of the active patterns FN positioned at both sides of each of the gate patterns GP. The source/drain regions SD in the PMOSFET region PR may be p-type impurity regions, and the source/drain regions SD in the NMOSFET region NR may be n-type impurity regions. The fin-shaped portions, which are positioned below and overlapped by the gate patterns GP, may serve as channel regions AF of transistors.

The source/drain regions SD may be epitaxial patterns formed by a selective epitaxial growth process. Accordingly, the source/drain regions SD may have top surfaces positioned at a higher level than those of the fin-shaped portions. The source/drain regions SD may include a semiconductor element different from those of the substrate 100. As an example, the source/drain regions SD may be formed of or include a semiconductor material having a lattice constant different from (for example, greater or smaller than) the substrate 100. Accordingly, the source/drain regions SD may exert a compressive stress or a tensile stress on the channel regions AF.

The gate patterns GP and the active patterns FN may constitute a plurality of logic transistors. For example, they may correspond to the logic layout described with reference to FIG. 6A.

Source/drain contacts CA may be provided between the gate patterns GP. The source/drain contacts CA may be arranged along the active patterns FN and in the second direction D2. As an example, the source/drain contacts CA may be respectively provided between the gate patterns GP on the PMOSFET and NMOSFET regions PR and NR and may be arranged in the first direction D1 (e.g., see FIG. 7C). The source/drain contacts CA may be directly coupled to and electrically connected to the source/drain regions SD. The source/drain contacts CA may be provided in the first interlayer insulating layer 110. The gate contact CB may be provided on at least one of the gate patterns GP.

First and second lower vias V11 and V12 may be provided on the first interlayer insulating layer 110 and in the second interlayer insulating layer 120. A first metal layer may be provided on the second interlayer insulating layer 120 and in the third interlayer insulating layer 130. The first metal layer may include first and second power lines PL1 and PL2 and first and second lower metal lines M11 and M12. The first and second power lines PL1 and PL2 may correspond to the first and second power patterns PL1 and PL2 described with reference to FIG. 6C, and the first and second lower metal lines M11 and M12 may correspond to the first and second pin patterns M11 and M12 described with reference to FIG. 6C.

As an example, the first lower metal line M11 may be electrically connected to one of the source/drain contacts CA through the first lower via V11. The second lower metal line M12 may be electrically connected to the gate contact CB through the second lower via V12.

The first and second power lines PL1 and PL2 may be provided outside and adjacent to the PMOSFET and NMOSFET regions PR and NR, respectively. The first power line PL1 may be connected to the source/drain contact CA through a lower via to allow a drain voltage (Vdd) (e.g., a power voltage) to be applied to the PMOSFET region PR. The second power line PL2 may be connected to the source/drain contact CA through the lower via to allow a source voltage (Vss) (e.g., a ground voltage) to be applied to the NMOSFET region NR.

First and second upper vias V21 and V22 may be provided on the third interlayer insulating layer 130 and in the fourth interlayer insulating layer 140. A second metal layer may be provided on the fourth interlayer insulating layer 140 and in the fifth interlayer insulating layer 150. The second metal layer may include first and second upper metal lines M21 and M22. The first and second upper metal lines M21 and M22 may correspond to the first and second interconnection patterns M21 and M22 described with reference to FIG. 6C.

As an example, the first upper metal line M21 may be electrically connected to the first lower metal line M11 through the first upper via V21. The second upper metal line M22 may be electrically connected to the second lower metal line M12 through the second upper via V22.

The first and second metal layers may be formed using a method of designing and fabricating a semiconductor device as described with reference to FIG. 2. For example, a high-level design process and a layout design process for a semiconductor integrated circuit may be performed to prepare the standard cell layout described with reference to FIG. 6C. Subsequently, an optical proximity correction may be performed to prepare modified metal layouts, and photomasks may be manufactured, based on the modified metal layouts.

The formation of the first metal layer may include forming a photoresist pattern, whose pattern is defined by the interconnection layout, on the third interlayer insulating layer 130. For example, a photoresist layer may be formed on the third interlayer insulating layer 130. Next, an exposure process may be performed on the photoresist layer using a photomask, which is manufactured based on the interconnection layout, and then a development process may be performed on the photoresist layer to form the photoresist pattern. In some examples, the photoresist pattern may be formed to have openings defining metal line holes.

Next, the third interlayer insulating layer 130 may be etched using the photoresist pattern as an etch mask, thereby forming interconnection holes. The first and second power lines PL1 and PL2 and the first and second lower metal lines M11 and M12 may be formed by filling the interconnection holes with conductive material. The conductive material may be formed of or include a metallic material (e.g., copper).

The second metal layer may be formed by a method similar to that for forming the first metal layer.

Figure 8A:
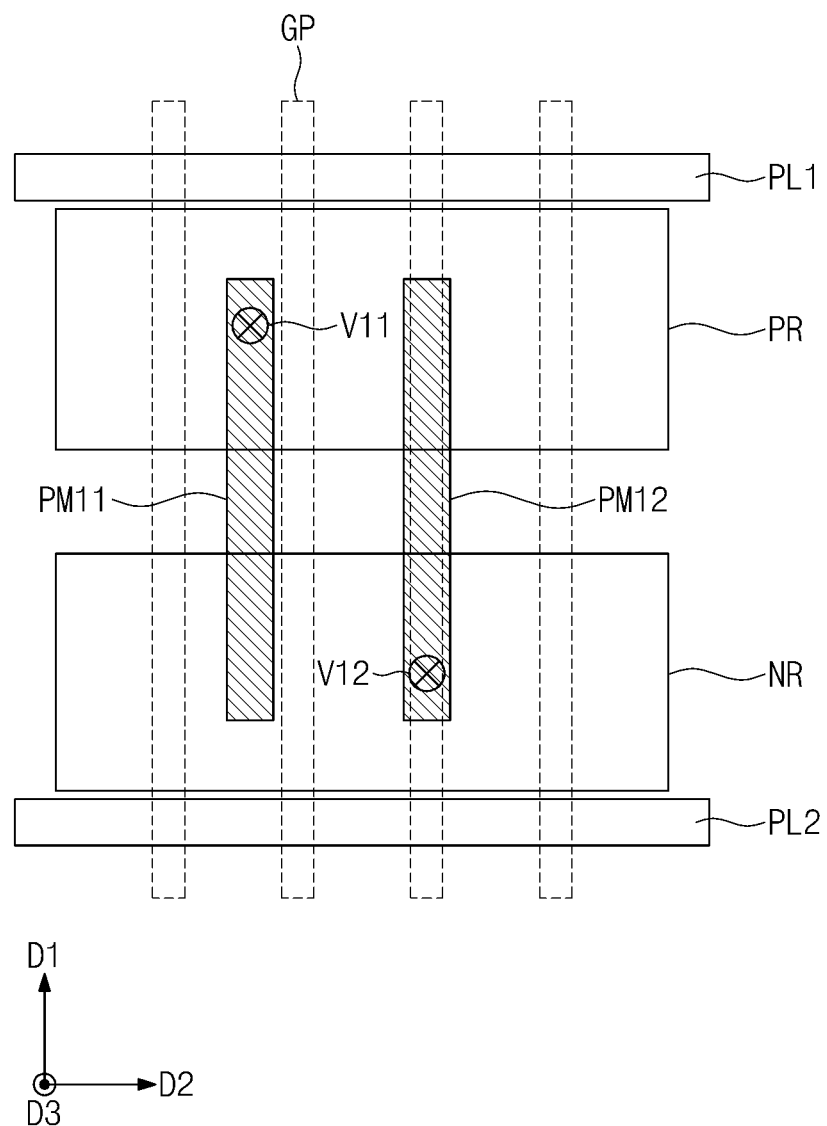
FIGS. 8A, 8B and 8C are plan views illustrating a method of laying out a standard cell and establishing a routing structure therefor, according to some examples of the inventive concept.
Figure 8B:
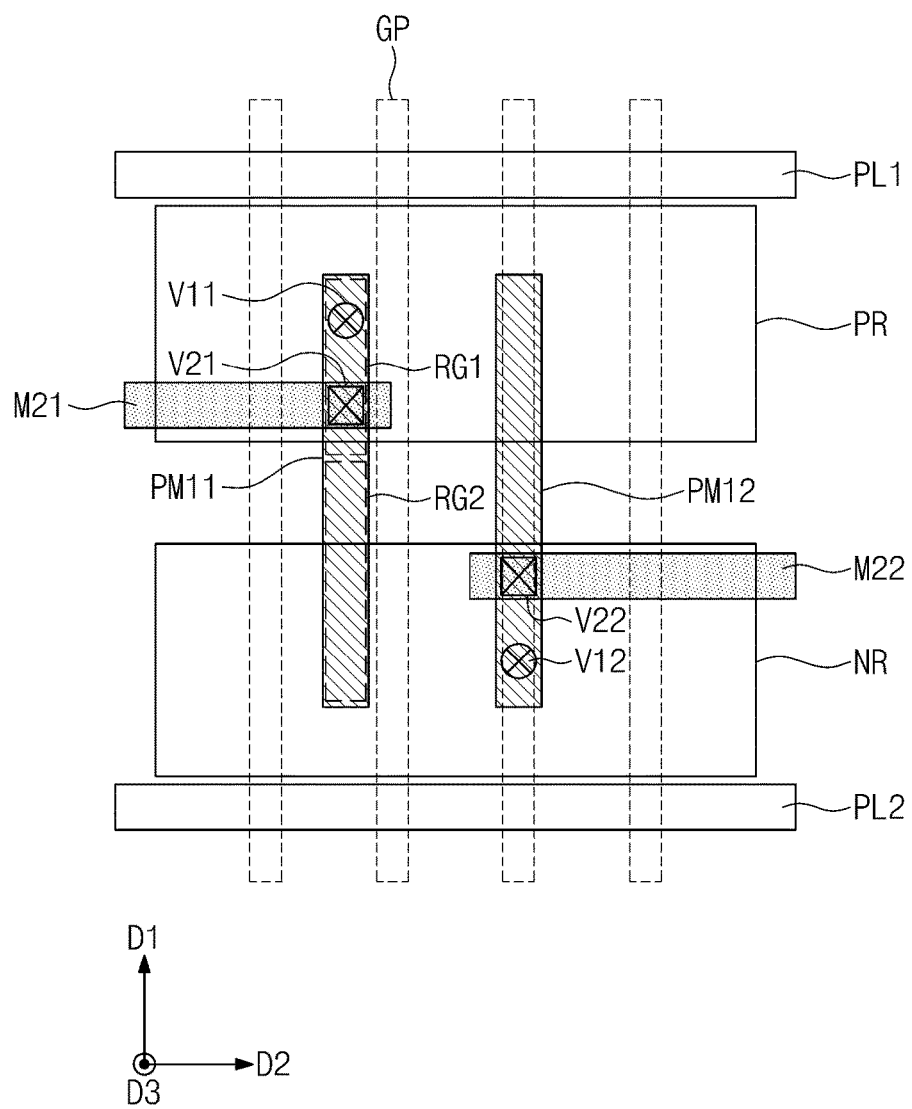
Figure 8C:
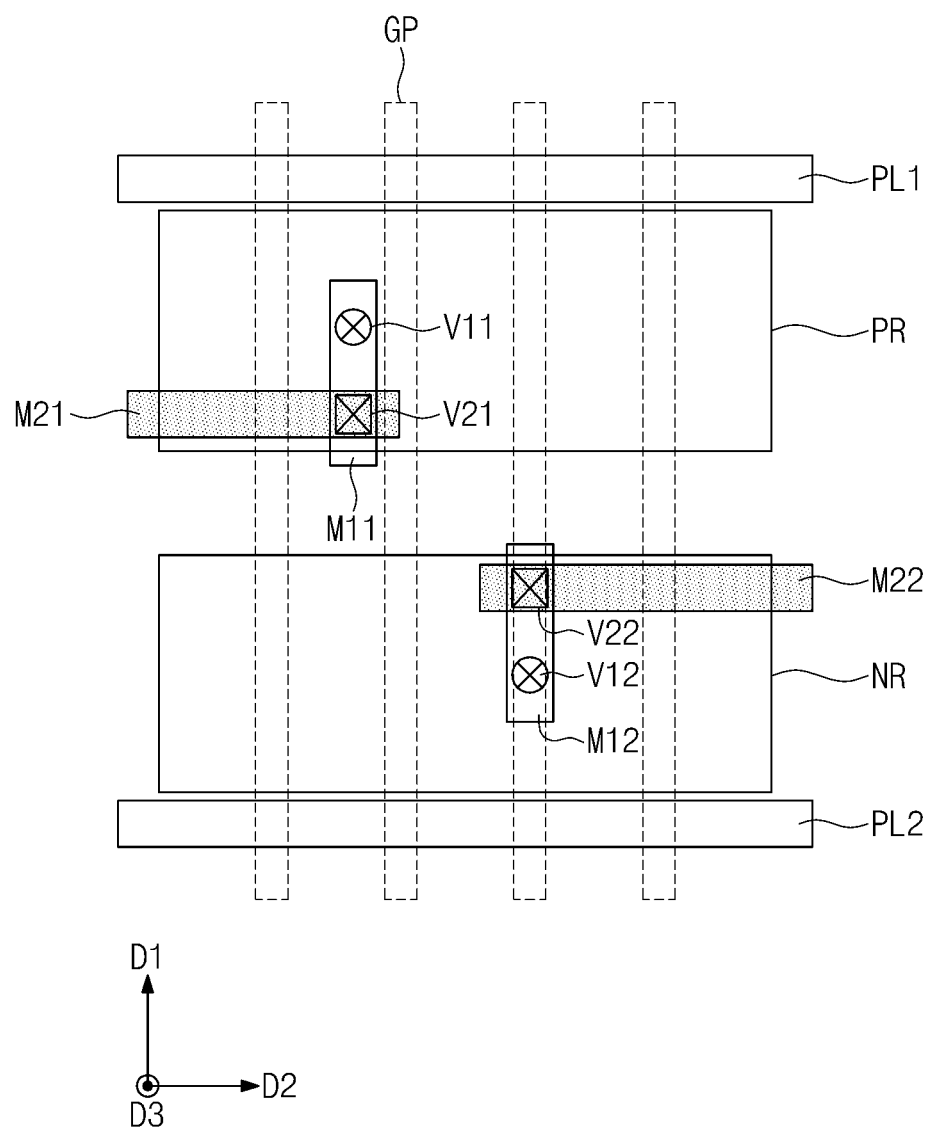

FIGS. 8A to 8C are plan views illustrating a method of laying out a standard cell and establishing a routing structure therefor, according to some examples of the inventive concept. In the following description of the present example, an element or step previously described with reference to FIGS. 6A to 6C may be designated by a similar or identical reference number to avoid the necessity of duplicating a detailed description thereof.

Referring to FIGS. 3 and 8A, an original standard cell layout may be prepared using the layout design tool (S121). In more detail, an interconnection layout may be provided, and the providing of the interconnection layout may include laying out the first and second power patterns PL1 and PL2, laying out the first and second preliminary pin patterns PM11 and PM12, and laying out the first and second lower via patterns V11 and V12. Each of the first and second preliminary pin patterns PM11 and PM12 may be substantially the same as a corresponding one of the first and second pin patterns M11 and M12 described with reference to FIG. 4A in terms of their shape and disposition.

The standard cell layout may be saved in the cell library described with reference to FIG. 2. Next, multiple ones of the standard cell layout saved in the cell library may be set in place (S122).

Referring to FIGS. 3 and 8B, a routing step may be performed on the standard cell layout to connect the standard cell to the high-level interconnection layout (S123). The providing of the high-level interconnection layout may include laying out the first and second interconnection patterns M21 and M22 and laying out the first and second upper via patterns V21 and V22.

Each of the first and second upper via patterns V21 and V22 may be placed on a corresponding one of overlapping regions of the first and second preliminary pin patterns PM11 and PM12 and the first and second interconnection patterns M21 and M22, respectively. For example, the first upper via pattern V21 may be placed on a first region RG1 of the first preliminary pin pattern PM11. A region of the first region RG1, on which the first upper via pattern V21 is placed, may be designated a first hitting region. The first lower via pattern V11 may be placed below the first region RG1. Another region of the first region RG1, on which the first lower via pattern V11 is placed, may be designated a second hitting region. The first preliminary pin pattern PM11 may be placed on a second region RG2 that does not overlap the first region RG1.

Referring to FIGS. 3 and 8C, the first and second pin patterns M11 and M12 may be placed in the interconnection layout, based on hitting information that may be obtained at the completion of the routing step (S124). In more detail, the first preliminary pin pattern PM11 may be processed to preserve the first region RG1 including the first and second hitting regions but remove the second region RG2. The remaining portion (e.g., the first region RG1) of the first preliminary pin pattern PM11 may serve as the first pin pattern M11. The second pin pattern M12 may be formed by processing the second preliminary pin pattern PM12 in the same manner as that for the first preliminary pin pattern PM11.

Figure 9A:
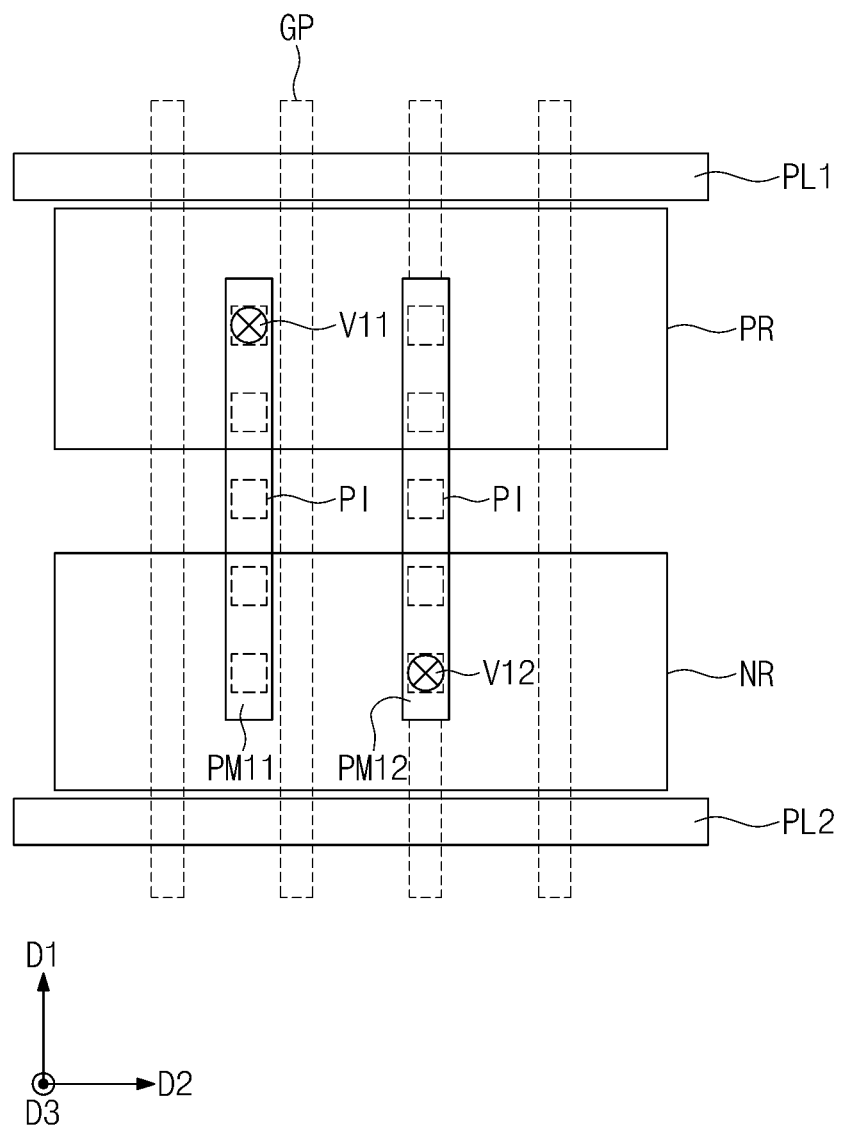
FIGS. 9A, 9C, and 9D are plan views illustrating a method of laying out a standard cell and establishing a routing structure therefor, according to some examples of the inventive concept.
Figure 9B:
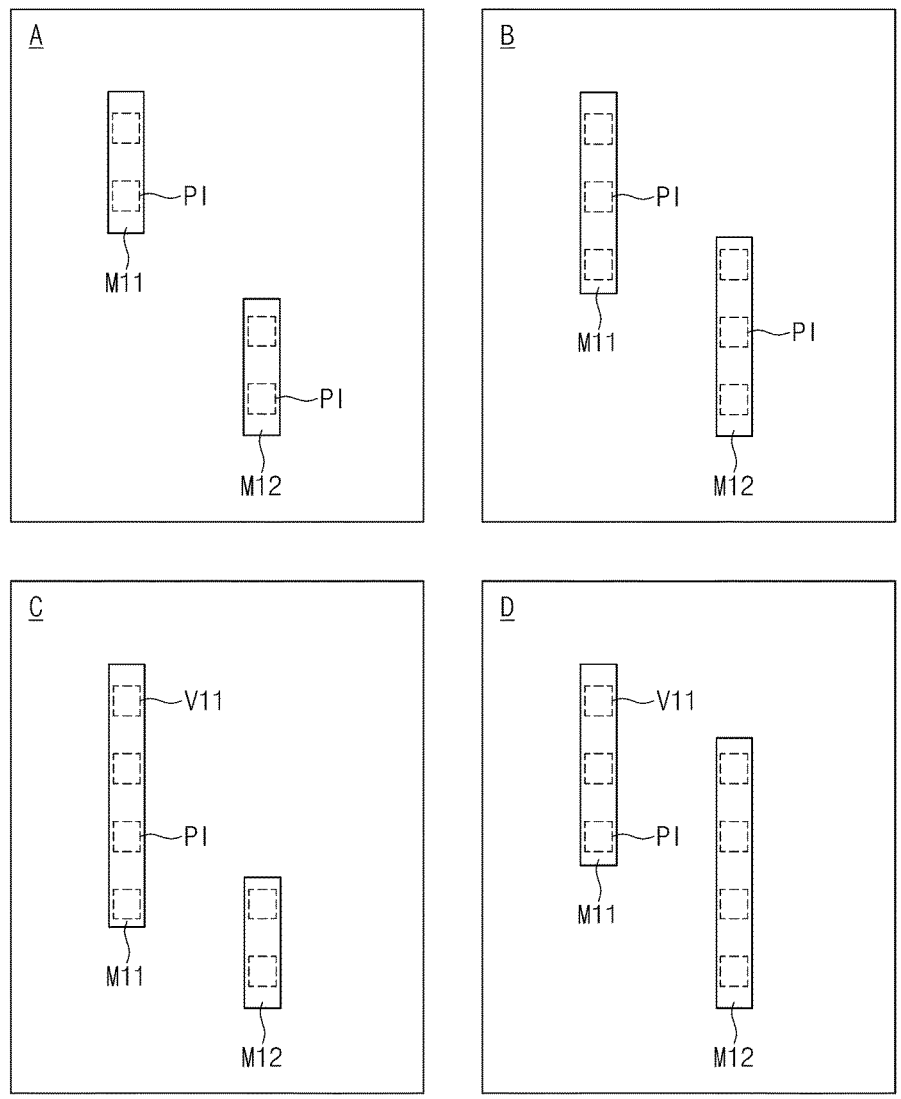
FIG. 9B is a plan view illustrating standard cell layouts whose interconnection layouts are different from each other.
Figure 9C:
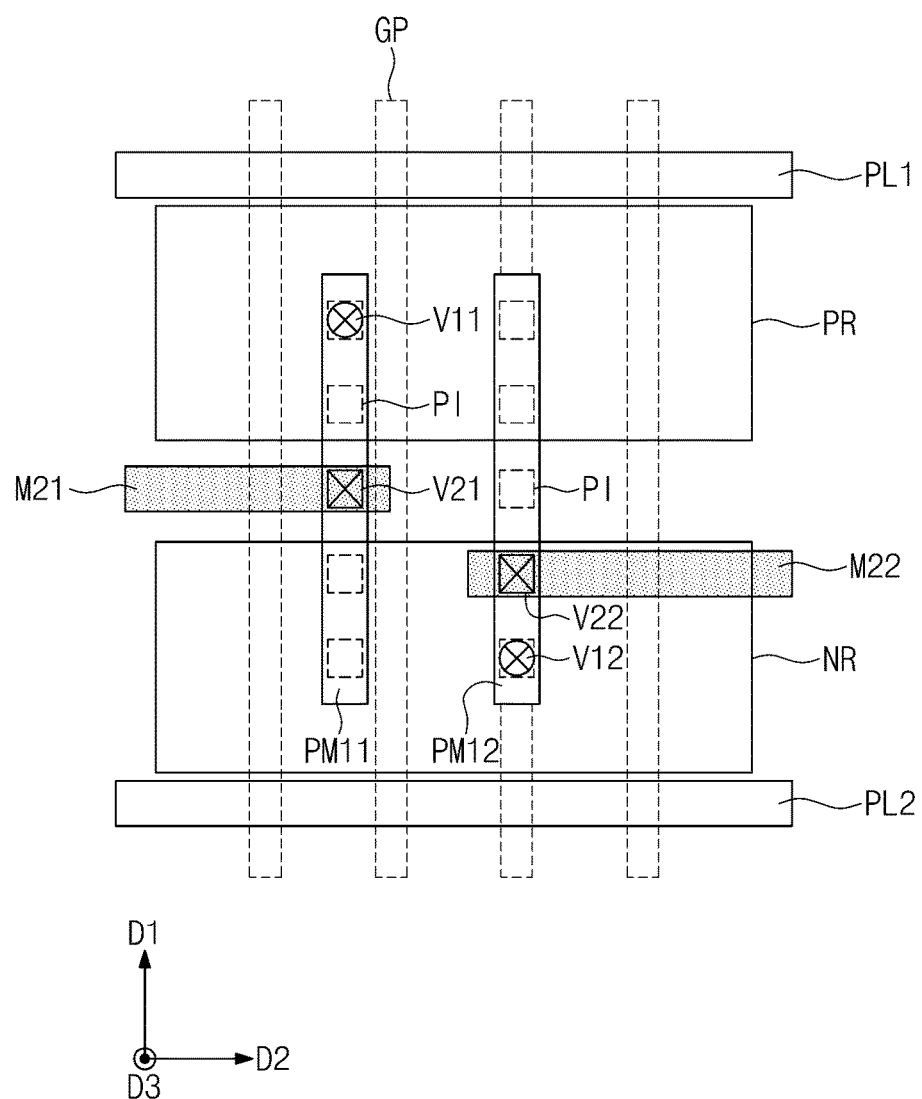
Figure 9D:
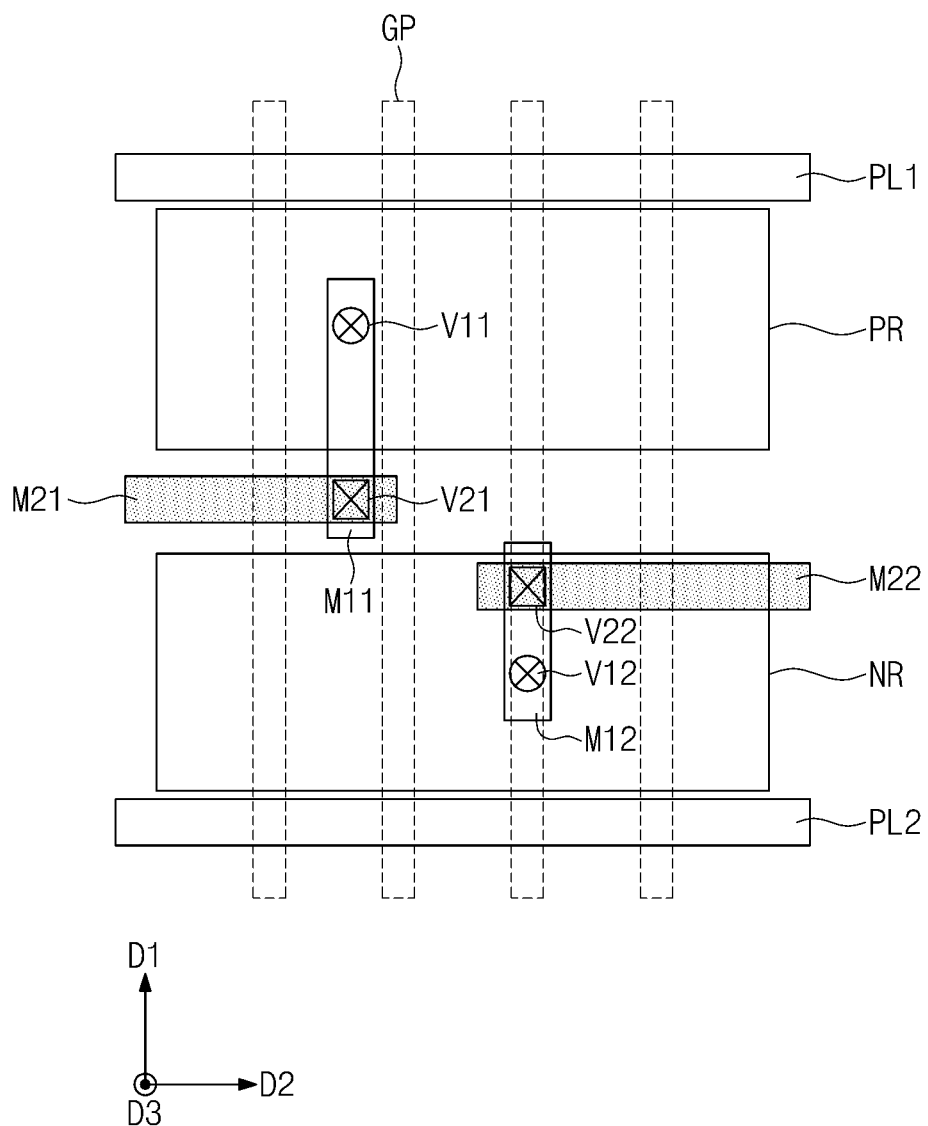

FIGS. 9A, 9C, and 9D are plan views illustrating a method of laying out a standard cell and establishing a routing structure therefor, according to some examples of the inventive concept. FIG. 9B is a plan view illustrating some examples of standard cell layouts whose interconnection layouts are different from each other. In the following description of the present example, an element or step previously described with reference to FIGS. 6A to 6C may be identified by a similar or identical reference number so as to avoid the necessity of duplicating the detailed description thereof.

Referring to FIGS. 3 and 9A, an original standard cell layout may be provided using the layout design tool (in S121). In more detail, an interconnection layout may be provided, and the providing of the interconnection layout may include laying out the first and second power patterns PL1 and PL2, laying out the first and second preliminary pin patterns PM11 and PM12, and laying out the first and second lower via patterns V11 and V12. Each of the first and second preliminary pin patterns PM11 and PM12 may be substantially the same as a corresponding one of the first and second pin patterns M11 and M12 described with reference to FIG. 4A in terms of their shape and disposition.

Referring to FIG. 9B, the original standard cell layout illustrated in FIG. 9A may be modified to produce first to fourth standard cell layouts A, B, C, and D, whose interconnection layouts are different from each other. For example, each of the standard cell layouts A, B, C, and D illustrated in FIG. 9B may have the same logic layout as the original standard cell layout of FIG. 9A but may have an interconnection layout different from the original standard cell layout of FIG. 9A.

For example, each of the first to fourth standard cell layouts A, B, C, and D may include the first and second pin patterns M11 and M12. In this example, the first and second pin patterns M11 and M12 are different from each other in terms of their sizes; that is, there may be a difference in the numbers of the pin regions PI provided in the first and second pin patterns M11 and M12. In addition, the first and second pin patterns M11 and M12 may be different from each other in terms of their relative positions.

Note, the first to fourth standard cell layouts A, B, C, and D are just examples of possible modifications of the standard cell layout, i.e., the standard cell layout may be modified, based on the numbers of the pin regions PI provided in the first and second preliminary pin patterns PM11 and PM12, to provide a different set of standard layouts. For example, in the case in which each of the first and second preliminary pin patterns PM11 and PM12 has five pin regions PI, the standard cell layout may be modified to produce a set of up to 5×5 (i.e., 25) standard cell layouts that are different from each other.

The original standard cell layout and the first to fourth standard cell layouts A, B, C, and D provided by the above process may be saved in the cell library described with reference to FIG. 2. Subsequently, multiple ones of the original standard cell layouts saved in the cell library may be set in place (S122).

Referring to FIGS. 3 and 9C, a routing step may be performed on the original standard cell layout to connect the original standard cell layout to the high-level interconnection layout (in S123). The providing of the high-level interconnection layout may include laying out the first and second interconnection patterns M21 and M22 and laying out the first and second upper via patterns V21 and V22.

Each of the first and second upper via patterns V21 and V22 may be placed on a corresponding one of overlapping regions of the first and second preliminary pin patterns PM11 and PM12 and the first and second interconnection patterns M21 and M22, respectively. Positions at which the first and second upper via patterns V21 and V22 will be provided may constitute a part of the hitting information.

For example, when viewed in the first direction D1, the first upper via pattern V21 may be provided in the third pin region of the first preliminary pin pattern PM11 and the second upper via pattern V22 may be provided in the second pin region of the second preliminary pin pattern PM12.

Referring to FIGS. 3 and 9D, the first and second pin patterns M11 and M12 may be placed in the interconnection layout, based on the hitting information (S124). In more detail, based on the hitting information, any original standard cell layout may be replaced with one of the first to fourth standard cell layouts A, B, C, and D.

For example, an interconnection layout including three pin region of the first pin pattern M11 and two pin regions of the second pin pattern M12 may be suitable for meeting the technical requirements imposed by the hitting information. In this case, referring to FIG. 9B, the second to fourth standard cell layouts B, C, and D are suitable to meet such requirements. However, among these second to fourth standard cell layouts B, C, and D the second standard cell layout B may be most desirable due to its smallest pin patterns M11 and M12 and because a device made based on this layout will exhibit the lowest parasitic capacitance among the devices made based on the second to fourth standard cell layouts B, C, and D. Accordingly, the original standard cell layout may be replaced by the second standard cell layout B.

Figure 10A:
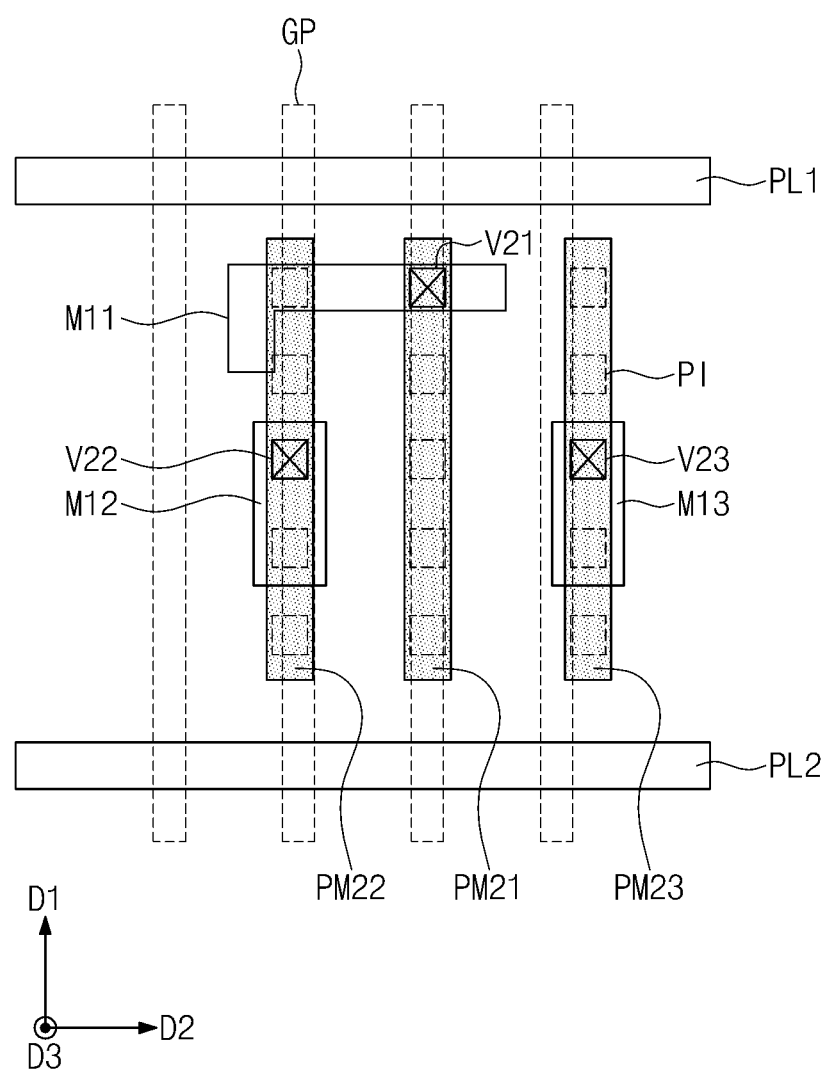
FIGS. 10A, 10B and 10C are plan views illustrating a method of laying out a standard cell and establishing a routing structure therefor, according to some examples of the inventive concept.
Figure 10B:
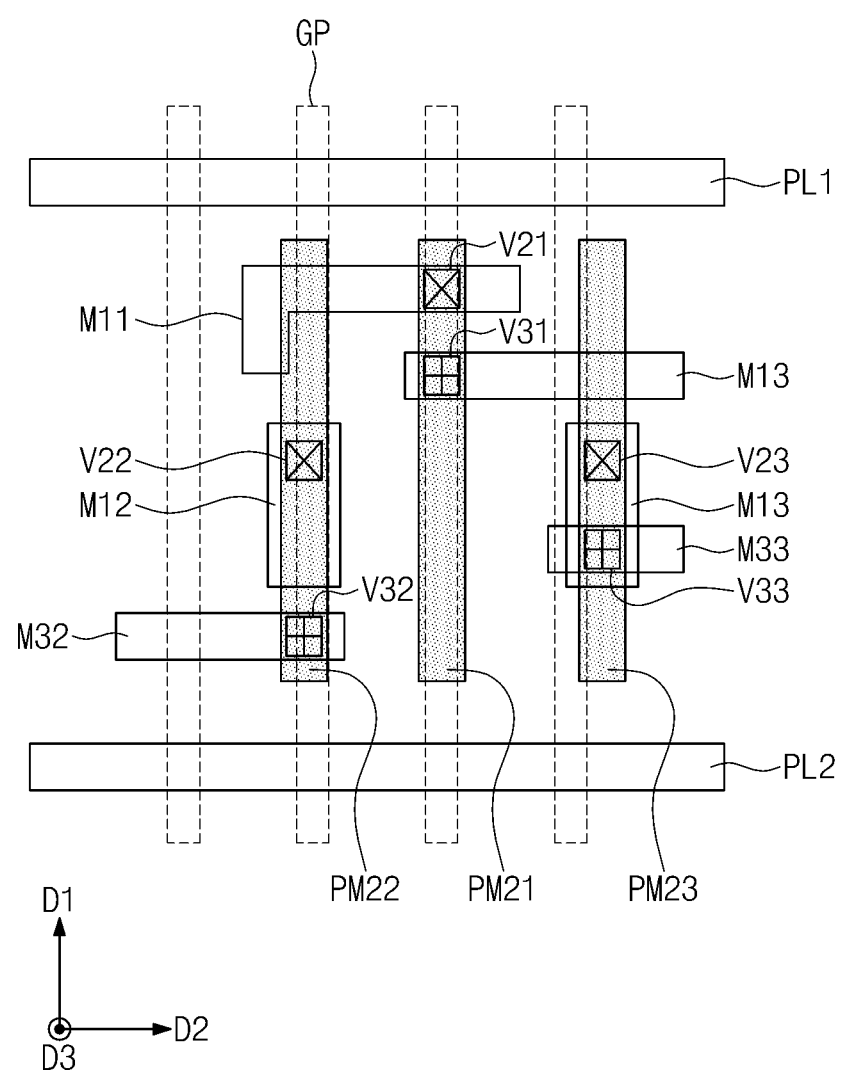
Figure 10C:
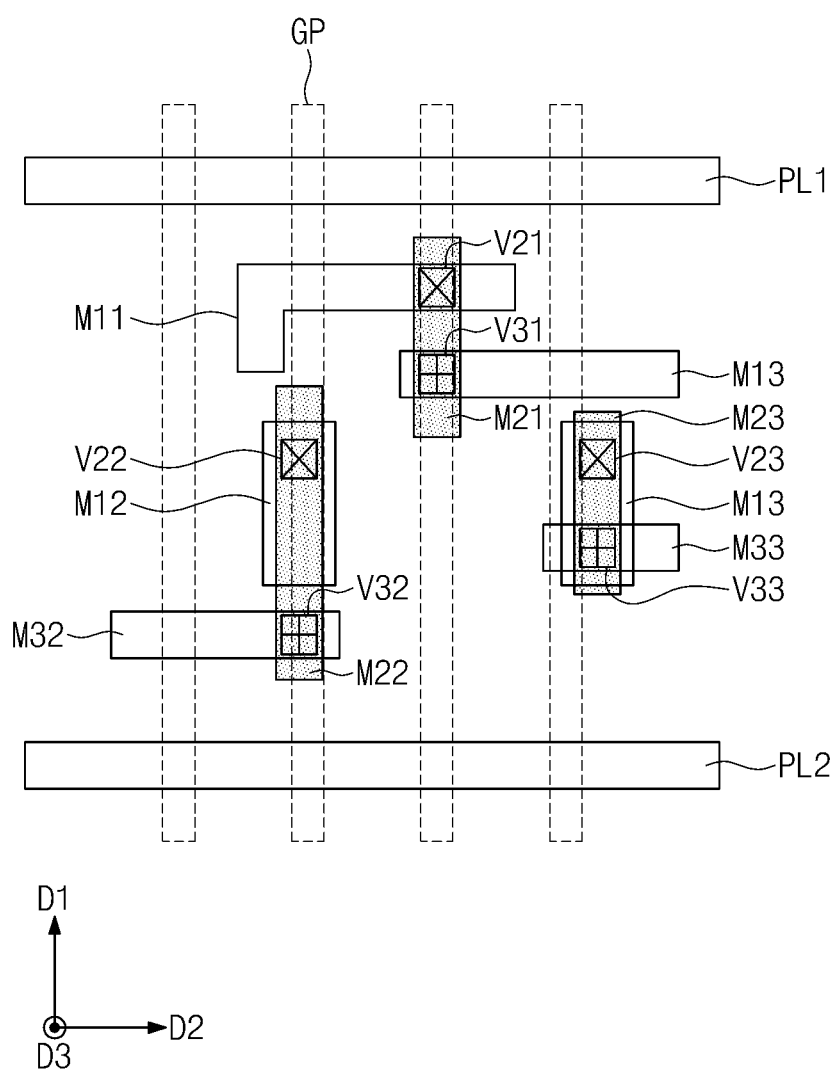

FIGS. 10A to 10C are plan views illustrating a method of laying out a standard cell and establishing a routing structure therefor, according to some examples of the inventive concept. In the following description of the present example, an element or step previously described with reference to FIGS. 6A to 6C may be identified by a similar or identical reference number to avoid the necessity of duplicating a detailed description thereof.

Referring to FIGS. 3 and 10A, an original standard cell layout may be provided using the layout design tool (S121). The providing of the standard cell layout may include providing first and second interconnection layouts. In some examples, the first interconnection layout may correspond to a first metal layer to be formed on the semiconductor substrate, and the second interconnection layout may correspond to a second metal layer to be formed on the semiconductor substrate. In other words, unlike the example illustrated in FIG. 6A, the standard cell layout may include a plurality of interconnection layouts, and the interconnection layouts may be changed depending on the type of circuits constituting the standard cell layout.

The providing of the first interconnection layout may include laying out the first and second power patterns PL1 and PL2 and laying out the first to third lower interconnection line patterns M11, M12, and M13. Although not shown, the first to third lower interconnection line patterns M11, M12, and M13 may be connected to the logic layout through the lower via patterns.

The preparation of the second interconnection layout may include laying out the first to third preliminary pin patterns PM21, PM22, and PM23 and laying out the first to third via patterns V21, V22, and V23. Each of the first to third via patterns V21, V22, and V23 may be disposed between a corresponding pair of the first to third lower interconnection line patterns M11, M12, and M13 and the first to third preliminary pin patterns PM21, PM22, and PM23 to connect the corresponding pair to each other.

The standard cell layout may be saved in the cell library described with reference to FIG. 2. Next, multiple ones of the standard cell layouts saved in the cell library may be set in place (S122).

Referring to FIGS. 3 and 10B, a routing step may be performed on the standard cell layout to connect the standard cell to the high-level interconnection layout (S123). The providing of the high-level interconnection layout may include laying out the first to third upper interconnection line patterns M31, M32, and M33 and laying out the first to third upper via patterns V31, V32, and V33. Each of the first to third upper via patterns V31, V32, and V33 may be placed on a corresponding one of overlapping regions of the first to third preliminary pin patterns PM21, PM22, and PM23 and the first to third upper interconnection line patterns M31, M32, and M33, respectively. At the completion of the routing step, hitting information may be obtained.

Referring to FIGS. 3 and 10C, first to third pin patterns M21, M22, and M23 may be provided or generated in the second interconnection layout, based on the hitting information (S124). The formation of the first to third pin patterns M21, M22, and M23 may be performed using one of the methods previously described with reference to FIGS. 6C, 8C, and 9D. As a result, the size of each of the first to third pin patterns M21, M22, and M23 may be decreased, compared to that of a corresponding one of the first to third preliminary pin patterns PM21, PM22, and PM23.

Unlike the example shown in and described with reference to FIGS. 6A to 6C and FIGS. 10A to 10C, the pin patterns of the standard cell layout are not be limited to being provided in the first metal layer and/or the second metal layer (above the substrate). Rather, as described above, the pin patterns may be laid out in the high-level metal layer (e.g., a third metal layer). Furthermore, the pin patterns may be provided in different metal layers; for example, a plurality of pin patterns may be laid out in each of the first and second metal layers.

Figure 11B:
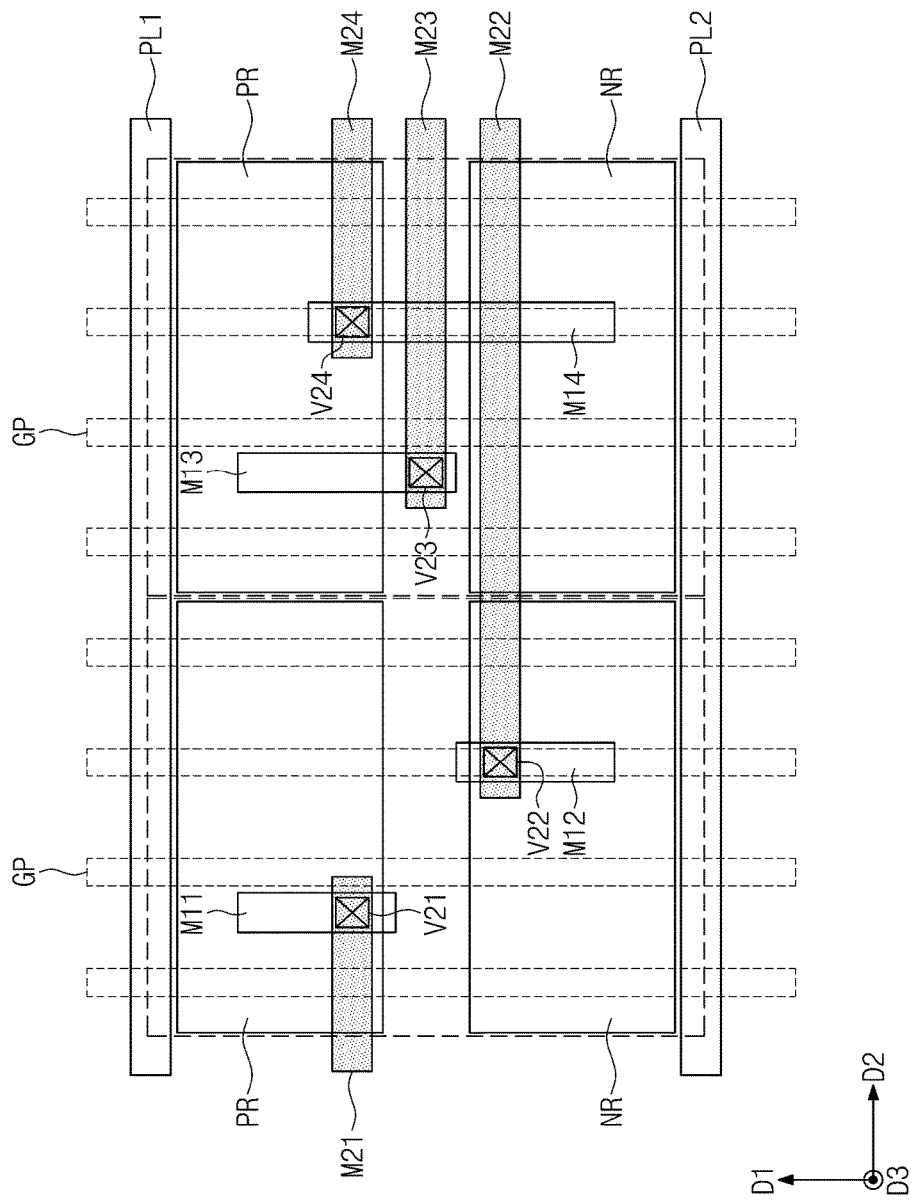

FIGS. 11A and 11B are plan views illustrating a method of laying out a standard cell and establishing a routing structure therefor, according to some examples of the inventive concept. In the following description of the present example, an element or step previously described with reference to FIGS. 6A to 6C may be identified by a similar or identical reference number so as to avoid the necessity of duplicating a detailed description thereof.

Referring to FIGS. 3 and 11A, the standard cell layout described with reference to FIG. 6A, 8A, or 9A may be provided (S121). The standard cell layout may be saved in the cell library described with reference to FIG. 2. Subsequently, multiple ones of the standard cell layout saved in the cell library may be set in place as aligned in the second direction D2 and parallel to each other (S122). A plurality of the same standard cell layouts may be set in place to form a first standard cell layout STD1 and a second standard cell layout STD2 each including the same logic layout with the same circuit. As an example, the first and second standard cell layouts STD1 and STD2 may represent an inverter. The first standard cell layout STD1 may have a first interconnection layout including the first and second preliminary pin patterns PM11 and PM12, and the second standard cell layout STD2 may have a second interconnection layout including third and fourth preliminary pin patterns PM13 and PM14. The first and second preliminary pin patterns PM11 and PM12 and the third and fourth preliminary pin patterns PM13 and PM14 may be the same as each other in terms of their size and position. Although not illustrated, additional standard cell layouts may be additionally interposed between the first and second standard cell layouts STD1 and STD2.

Referring to FIGS. 3 and 11B, a routing step may be performed on the first and second standard cell layouts STD1 and STD2 to connect the first and second standard cell layouts STD1 and STD2 to the high-level interconnection layout (S123). Although the first and second standard cell layouts STD1 and STD2 are the same, the first and second standard cell layouts STD1 and STD2 may be connected to standard cells different from each other in the routing step, and thus, the first and second standard cell layouts STD1 and STD2 may have different hitting information associated therewith. As an example, the first standard cell layout STD1 may be connected to first and second interconnection patterns M21 and M22 constituting the high-level interconnection layout. The second standard cell layout STD2 may be connected to third and fourth interconnection patterns M23 and M24 constituting the high-level interconnection layout.

Based on the hitting information, the first and second pin patterns M11 and M12 may be provided or generated in the first interconnection layout and the third and fourth pin patterns M13 and M14 may be provided or generated in the second interconnection layout (in S124). The first and second pin patterns M11 and M12 and/or the third and fourth pin patterns M13 and M14 may be formed using one of the methods previously described with reference to FIGS. 6C, 8C, and 9D. Accordingly, it is possible to provide the first and second pin patterns M11 and M12 and the third and fourth pin patterns M13 and M14, whose sizes and dispositions are different from each other, in the same standard cell layouts (e.g., the first and second standard cell layouts STD1 and STD2).

On the contrary, if the pin patterns were newly generated after the step of laying out the standard cell layout and establishing a routing structure therefor (e.g., see FIG. 4B or FIG. 5B), the same standard cell layouts may have the same pin patterns (e.g., having the same size and the same arrangement), regardless of whether there is a difference in the routing step. By contrast, in the layout design method according to some examples of the inventive concept, although the standard cell layouts are the same, it is possible to realize pin patterns for the standard cell layouts, respectively, that are different from each other in terms of their size and relative position. This makes it possible to realize a semiconductor device with optimized characteristics.

According to some examples of the inventive concept, a method of designing a layout of a semiconductor device may include laying out pin patterns in an interconnection layout of a standard cell layout, based on hitting information obtained after a routing step. Accordingly, it is possible to maximize the degree of freedom in the routing and realize a semiconductor device with high operation speed and low power consumption characteristics.

Finally, although examples of the inventive concepts have been particularly shown and described, it will be understood by one of ordinary skill in the art that variations in form and detail may be made thereto without departing from the spirit and scope of the inventive concept as defined by the attached claims.

What is claimed is:

1. A method of producing a layout of a semiconductor device, comprising:
providing a standard cell layout, the providing of the standard cell layout comprising creating a preliminary pin pattern of an interconnection layout of the standard cell layout in association with a lower metal layer of the semiconductor device;
performing a routing step to produce a high-level interconnection layout in which a the preliminary pin pattern is connected to a high-level interconnection pattern, the high-level interconnection layout representative of an upper level metal interconnection of the semiconductor device disposed above the lower metal layer; and
converting the preliminary pin pattern into a postliminary pin pattern in a region of the interconnection layout of the standard cell layout, based on hitting information obtained upon the completion of the routing step, the postliminary pin pattern representative of a lower level metal interconnection of the lower metal layer of the semiconductor device,
wherein the postliminary pin pattern is different from the preliminary pin pattern.

2. The method of claim 1, wherein the postliminary pin pattern is different from the preliminary pin pattern in terms of size and arrangement.

3. The method of claim 1, wherein the converting of the preliminary pin pattern into the postliminary pin pattern places the postliminary pin pattern in a region that was occupied by the preliminary pin pattern such that the postliminary pin pattern and the preliminary pin pattern occupy overlapping regions in the method of producing the layout.

4. The method of claim 1, wherein the providing of the standard cell layout comprises:
providing a logic layout including logic transistors; and
laying out a lower via pattern to connect the logic layout to the preliminary pin pattern.

5. The method of claim 1, wherein the laying out of the preliminary pin pattern comprises laying out ghost patterns, in which pin information for the routing step is contained, and
the converting of the preliminary pin pattern into the postliminary pin pattern comprises converting one of the ghost patterns that hits the high-level interconnection layout into the postliminary pin pattern.

6. The method of claim 1, wherein the converting of the preliminary pin pattern into the postliminary pin pattern comprises preserving a first region of the preliminary pin pattern while removing a second region of the preliminary pin pattern, and
the first region comprises a first hitting region to be connected to the high-level interconnection layout.

7. The method of claim 1, further comprising providing a plurality of cell layouts, each based on the standard cell layout,
wherein the cell layouts have different interconnection layouts from one another, and
the converting of the preliminary pin pattern into the postliminary pin pattern comprises replacing the standard cell layout with one of the cell layouts, based on the hitting information.

8. The method of claim 1, further comprises laying out multiple ones of the standard cell layout, before the routing step.

9. A method of fabricating a semiconductor device, comprising:
a process of generating a layout of a semiconductor device, the layout comprising a standard cell layout;
manufacturing a photomask having a mask pattern based on the layout of the semiconductor device; and
forming layers of metal lines and vias on a substrate using the photomask, the vias vertically connecting different layers of the metal lines,
wherein the generating of the layout of the semiconductor device comprises:
laying out a lower via pattern on a logic layout of the standard cell layout;
laying out a preliminary pin pattern on the lower via pattern;
performing a routing step on the standard cell layout, which places a high-level interconnection layout and an upper via pattern on the preliminary pin pattern, the upper via pattern connecting the preliminary pin pattern to an element of the high-level interconnection layout; and
generating a postliminary pin pattern connecting the lower via pattern to the upper via pattern, wherein the postliminary pin pattern and the preliminary pin pattern occupy overlapping regions in the process.

10. The method of claim 9, wherein the postliminary pin pattern is different from the preliminary pin pattern in terms of size and arrangement.

11. The method of claim 9, wherein the laying out of the preliminary pin pattern comprises laying out a ghost pattern, in which pin information for the routing step is contained, and wherein the upper via pattern is placed on the ghost pattern in the routing step, and
the generating of the postliminary pin pattern comprises converting the ghost pattern into the pin pattern.

12. The method of claim 9, wherein the generating of the postliminary pin pattern comprises preserving a first region of the preliminary pin pattern while removing a second region of the preliminary pin pattern, and
the first region comprises a region overlapped by the upper via pattern.

13. The method of claim 12, wherein the first region further comprises a region overlapping the lower via pattern.

14. The method of claim 9, wherein the process of generating of the layout of the semiconductor device further comprises generating a plurality of cell layouts each based on the standard cell layout, and wherein each one of the cell layouts comprises pin patterns that are different from those of each other of the cell layouts in terms of the sizes and arrangement of the pin patterns, and
the generating of the postliminary pin pattern comprises replacing the standard cell layout with one of the cell layouts in consideration of the location of the upper via pattern.

15. A method of fabricating a semiconductor device, comprising:
a process of generating a layout of a semiconductor device, the layout comprising a standard cell layout;
manufacturing a photomask having a mask pattern based on the layout of the semiconductor device; and
forming layers of metal lines and vias on a substrate using the photomask, the vias vertically connecting different layers of the metal lines,
wherein the generating of the layout of the semiconductor device comprises:
laying out a lower via pattern on a logic layout of the standard cell layout;
laying out a preliminary pin pattern on the lower via pattern;
performing a routing step on the standard cell layout, which places a high-level interconnection layout and an upper via pattern on the preliminary pin pattern, the upper via pattern connecting the preliminary pin pattern to an element of the high-level interconnection layout; and
changing size of the preliminary pin pattern to generate a postliminary pin pattern connecting the lower via pattern to the upper via pattern.

16. The method of claim 15, wherein the laying out of the preliminary pin pattern comprises laying out a ghost pattern, in which pin information for the routing step is contained, and wherein the upper via pattern is placed on the ghost pattern in the routing step, and
the generating of the postliminary pin pattern comprises converting the ghost pattern into the pin pattern.

17. The method of claim 15, wherein the generating of the postliminary pin pattern comprises preserving a first region of the preliminary pin pattern while removing a second region of the preliminary pin pattern, and
the first region comprises a region overlapped by the upper via pattern.

18. The method of claim 17, wherein the first region further comprises a region overlapping the lower via pattern.

19. The method of claim 15, wherein the process of generating of the layout of the semiconductor device further comprises generating a plurality of cell layouts each based on the standard cell layout, and wherein each one of the cell layouts comprises pin patterns that are different from those of each other of the cell layouts in terms of the sizes and arrangement of the pin patterns, and the generating of the postliminary pin pattern comprises replacing the standard cell layout with one of the cell layouts in consideration of the location of the upper via pattern.

* * * * *